United States Patent
Saito et al.

(10) Patent No.: US 10,991,745 B2
(45) Date of Patent: Apr. 27, 2021

(54) SEMICONDUCTOR DEVICE, METHOD OF MANUFACTURING THE SAME, AND ELECTRONIC APPARATUS

(71) Applicant: SONY SEMICONDUCTOR SOLUTIONS CORPORATION, Kanagawa (JP)

(72) Inventors: Suguru Saito, Kanagawa (JP); Nobutoshi Fujii, Kanagawa (JP); Ryosuke Matsumoto, Tokyo (JP); Yoshifumi Zaizen, Kanagawa (JP); Shuji Manda, Kanagawa (JP); Shunsuke Maruyama, Kanagawa (JP); Hideo Shimizu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/604,062

(22) PCT Filed: Apr. 16, 2018

(86) PCT No.: PCT/JP2018/015730
§ 371 (c)(1),
(2) Date: Oct. 9, 2019

(87) PCT Pub. No.: WO2018/194030
PCT Pub. Date: Oct. 25, 2018

(65) Prior Publication Data
US 2020/0035739 A1 Jan. 30, 2020

(30) Foreign Application Priority Data
Apr. 19, 2017 (JP) .............................. JP2017-082562

(51) Int. Cl.
*H01L 27/146* (2006.01)
*H01L 31/0296* (2006.01)
*H01L 31/0304* (2006.01)

(52) U.S. Cl.
CPC .... *H01L 27/14634* (2013.01); *H01L 27/1467* (2013.01); *H01L 27/1469* (2013.01);
(Continued)

(58) Field of Classification Search
None
See application file for complete search history.

(56) References Cited

U.S. PATENT DOCUMENTS

2012/0211849 A1 8/2012 Matsugai
2013/0341694 A1 12/2013 Maekawa et al.
(Continued)

FOREIGN PATENT DOCUMENTS

JP 2005-347475 12/2005
JP 2014-521216 8/2014
(Continued)

OTHER PUBLICATIONS

International Search Report and Written Opinion prepared by the Japan Patent Office dated Jun. 22, 2018, for International Application No. PCT/JP2018/015730.
(Continued)

*Primary Examiner* — Thien F Tran
(74) *Attorney, Agent, or Firm* — Sheridan Ross P.C.

(57) ABSTRACT

A semiconductor device including a device substrate and a readout circuit substrate. The device substrate includes a device region and a peripheral region. In the device region, a wiring layer and a first semiconductor layer including a compound semiconductor material are stacked. The peripheral region is disposed outside the device region. The readout circuit substrate faces the first semiconductor layer
(Continued)

with the wiring layer in between, and is electrically coupled to the first semiconductor layer through the wiring layer. The peripheral region of the device substrate has a junction surface with the readout circuit substrate.

19 Claims, 36 Drawing Sheets

(52) U.S. Cl.
CPC .. *H01L 27/14627* (2013.01); *H01L 27/14636* (2013.01); *H01L 31/02966* (2013.01); *H01L 31/03046* (2013.01)

(56) References Cited

U.S. PATENT DOCUMENTS

| | | |
|---|---|---|
| 2014/0035083 A1 | 2/2014 | Wan et al. |
| 2015/0122995 A1 | 5/2015 | Mabuchi et al. |
| 2015/0179693 A1 | 6/2015 | Maruyama |
| 2016/0035921 A1* | 2/2016 | Matsuda ........... H01L 27/14645 348/374 |
| 2016/0043144 A1 | 2/2016 | Sato |
| 2016/0181305 A1 | 6/2016 | Mabuchi et al. |
| 2018/0040662 A1 | 2/2018 | Mabuchi et al. |

FOREIGN PATENT DOCUMENTS

| | | |
|---|---|---|
| JP | 2014-232761 | 12/2014 |
| JP | 2015-088691 | 5/2015 |

OTHER PUBLICATIONS

Extended European Search Report for European Patent Application No. 18787243.7, dated Mar. 18, 2020, 7 pages.

\* cited by examiner

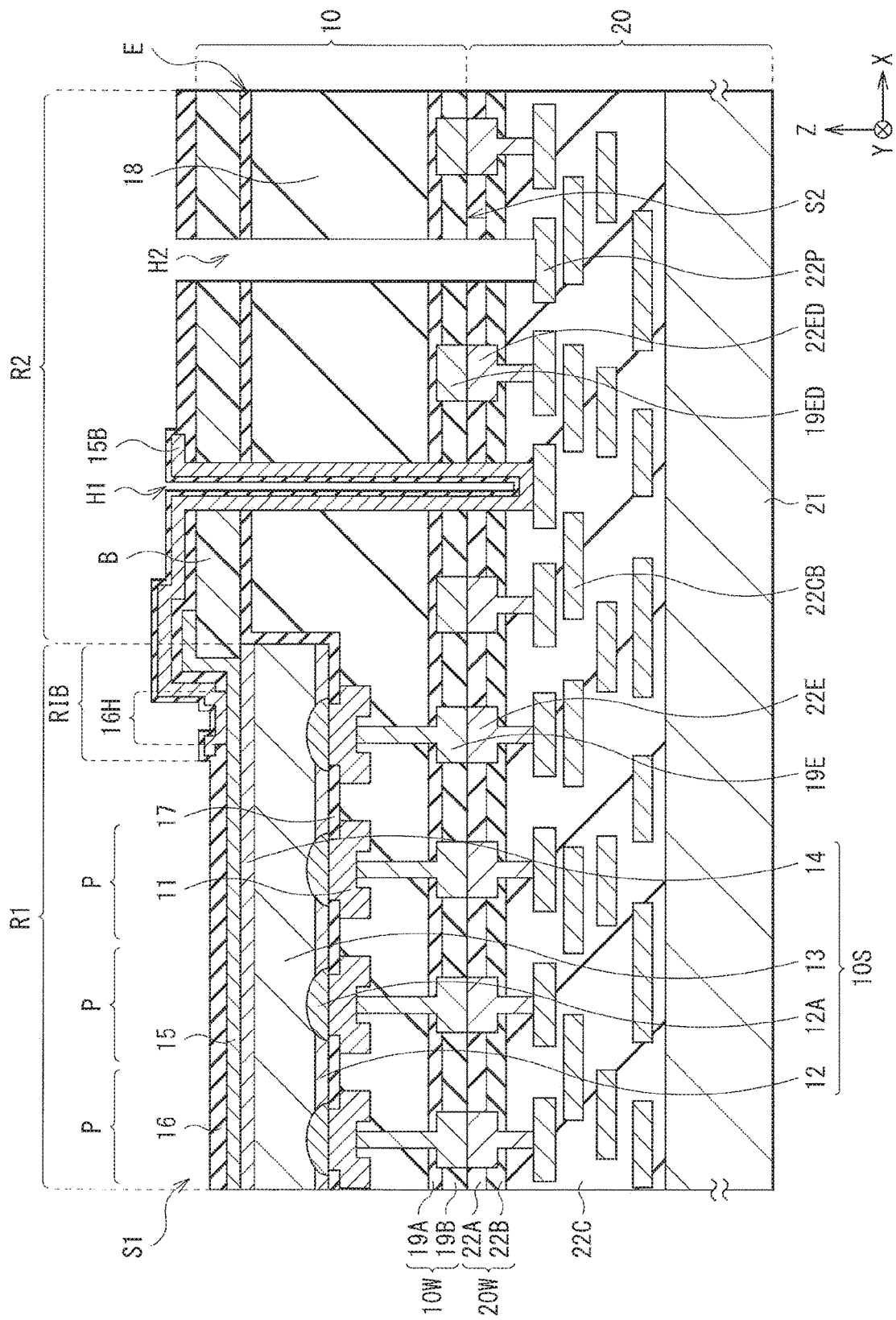

SEMICONDUCTOR DEVICE, METHOD OF MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2018/015730 having an international filing date of 16 Apr. 2018, which designated the United States, which PCT application claimed the benefit of Japanese Patent Application No. 2017-082562 filed 19 Apr. 2017 and PCT Application No. PCT/JP2018/009038 filed 8 Mar. 2018, the entire disclosures of each of which are incorporated herein by reference.

TECHNICAL FIELD

The present disclosure relates to a semiconductor device used for, for example, an infrared sensor or the like, a method of manufacturing the same, and an electronic apparatus.

BACKGROUND ART

An image sensor having sensitivity in an infrared region (an infrared sensor), has been commercialized in recent years. A semiconductor device used for the infrared sensor has a photoelectric conversion layer that includes a group III-V semiconductor such as, for example, indium gallium arsenide (InGaAs). Such a photoelectric conversion layer generates electrical charges through absorption of infrared light (performs photoelectric conversion). For example, reference is made to PTL 1.

In PTL 1, InGaAs epitaxially grown on a growth substrate including indium phosphide (InP) is used as the photoelectric conversion layer.

CITATION LIST

Patent Literature

PTL 1: Japanese Unexamined Patent Application Publication (Published Japanese Translation of PCT Application) No. 2014-521216

SUMMARY OF THE INVENTION

However, in such a semiconductor device, a size of the growth substrate may exert an influence on manufacturing processes. Hence, it is desired to enable the semiconductor device to be manufactured without influence of the size of the growth substrate.

It is therefore desirable to provide a semiconductor device that is manufacturable without influence of the size of the growth substrate, a method of manufacturing the semiconductor device, and an electronic apparatus.

A method of manufacturing a semiconductor device according to an embodiment of the present disclosure includes: forming a semiconductor layer that includes a compound semiconductor material; bonding the semiconductor layer to a temporary substrate; forming a buried layer that fills a level difference between the semiconductor layer and the temporary substrate; forming a wiring layer on a surface of the semiconductor layer, the surface being opposite to a junction surface with the temporary substrate; and providing a readout circuit substrate to face the semiconductor layer with the wiring layer in between and electrically coupling the semiconductor layer and the readout circuit substrate to each other through the wiring layer.

In the method of manufacturing the semiconductor device according to the embodiment of the present disclosure, the buried layer is formed, which reduces a level difference between the semiconductor layer and the temporary substrate, thereby suppressing occurrence of a defect in manufacturing processes resulting from the level difference.

A semiconductor device according to an embodiment of the present disclosure includes: a device substrate including a device region and a peripheral region, the device region in which a wiring layer and a first semiconductor layer including a compound semiconductor material are stacked, and the peripheral region disposed outside the device region; and a readout circuit substrate that faces the first semiconductor layer with the wiring layer in between and is electrically coupled to the semiconductor layer through the wiring layer. The peripheral region of the device substrate has a junction surface with the readout circuit substrate.

An electronic apparatus according to an embodiment of the present disclosure includes the semiconductor device according to the foregoing embodiment of the present disclosure.

In the semiconductor device and the electronic apparatus according to the embodiments of the present disclosure, the peripheral region of the device substrate has the junction surface with the readout circuit substrate. In other words, the device substrate is bonded to the readout circuit substrate in a state in which a level difference between the device region and the peripheral region is small or no level difference is present between the device region and the peripheral region. For example, the semiconductor device and the electronic apparatus according to the embodiments of the present disclosure are manufactured with use of the method of manufacturing the semiconductor device according to the embodiment of the present disclosure.

According to the semiconductor device, the method of manufacturing the semiconductor device, and the electronic apparatus of the embodiments of the present disclosure, occurrence of a defect in manufacturing processes resulting from a level difference between the (first) semiconductor layer and the temporary substrate is suppressed, which makes it possible to perform manufacturing with use of the temporary substrate. This makes it possible to perform manufacturing without influence of a size of a growth substrate used to form the semiconductor layer.

It is to be noted that contents described above are examples of the present disclosure. Effects of the present disclosure are not limited to effects described above, and may be effects other than those described above, or may further include other effects in addition to those described above.

BRIEF DESCRIPTION OF DRAWINGS

FIG. 3 is a schematic cross-sectional view of another example (2) of a configuration of the adhesive layer illustrated in FIG. 1B.

MODES FOR CARRYING OUT THE INVENTION

Some embodiments of the present disclosure are described in detail below with reference to drawings. It is to be noted that description is given in the following order.
1. First Embodiment (an Example of a Light-Receiving Device in Which a Peripheral Region of a Device Substrate has a Junction Surface with a Readout Circuit Substrate)
2. First Modification Example (an Example Including a First Buried Layer and a Second Buried Layer)
3. Second Modification Example (an Example Including a Color Filter and an On-Chip Lens)
4. Second Embodiment (an Example of a Light-Receiving Device Manufactured with Use of a Cap Layer)
5. Third Embodiment (an Example of a Light-Receiving Device in Which a Semiconductor Layer Including Silicon is Stacked on a Device Substrate)
6. First Application Example (an Example of an Imaging Device)
7. Second Application Example (an Example of an Electronic Apparatus)
8. First Further Application Example (an Application Example to an Endoscopic Surgery System)
9. Second Further Application Example (an Application Example to a Mobile Body)

First Embodiment

Configuration

Figure 1A:
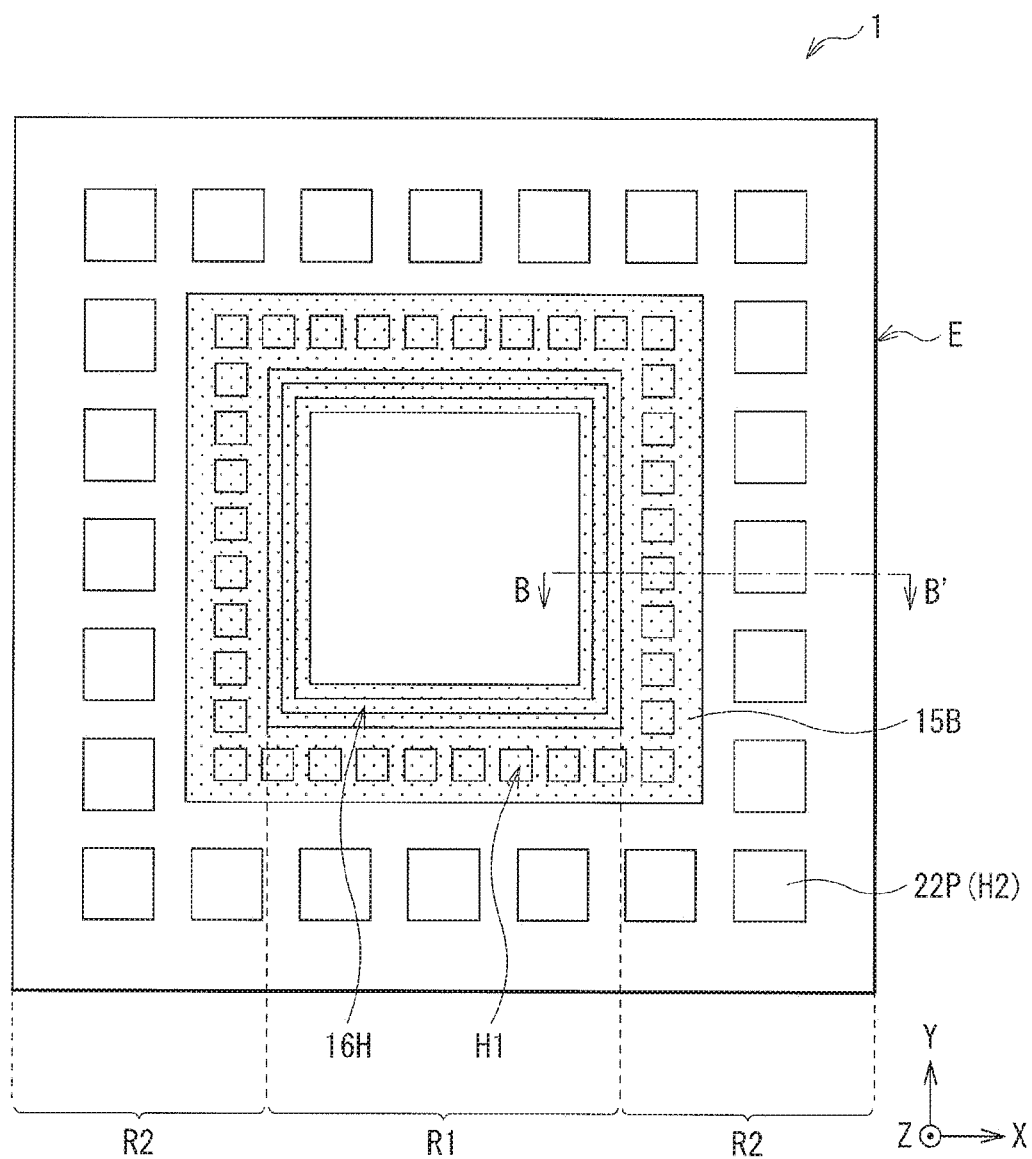
FIG. 1A is a schematic plan view of a schematic configuration of a light-receiving device according to a first embodiment of the present disclosure.
Figure 1B:
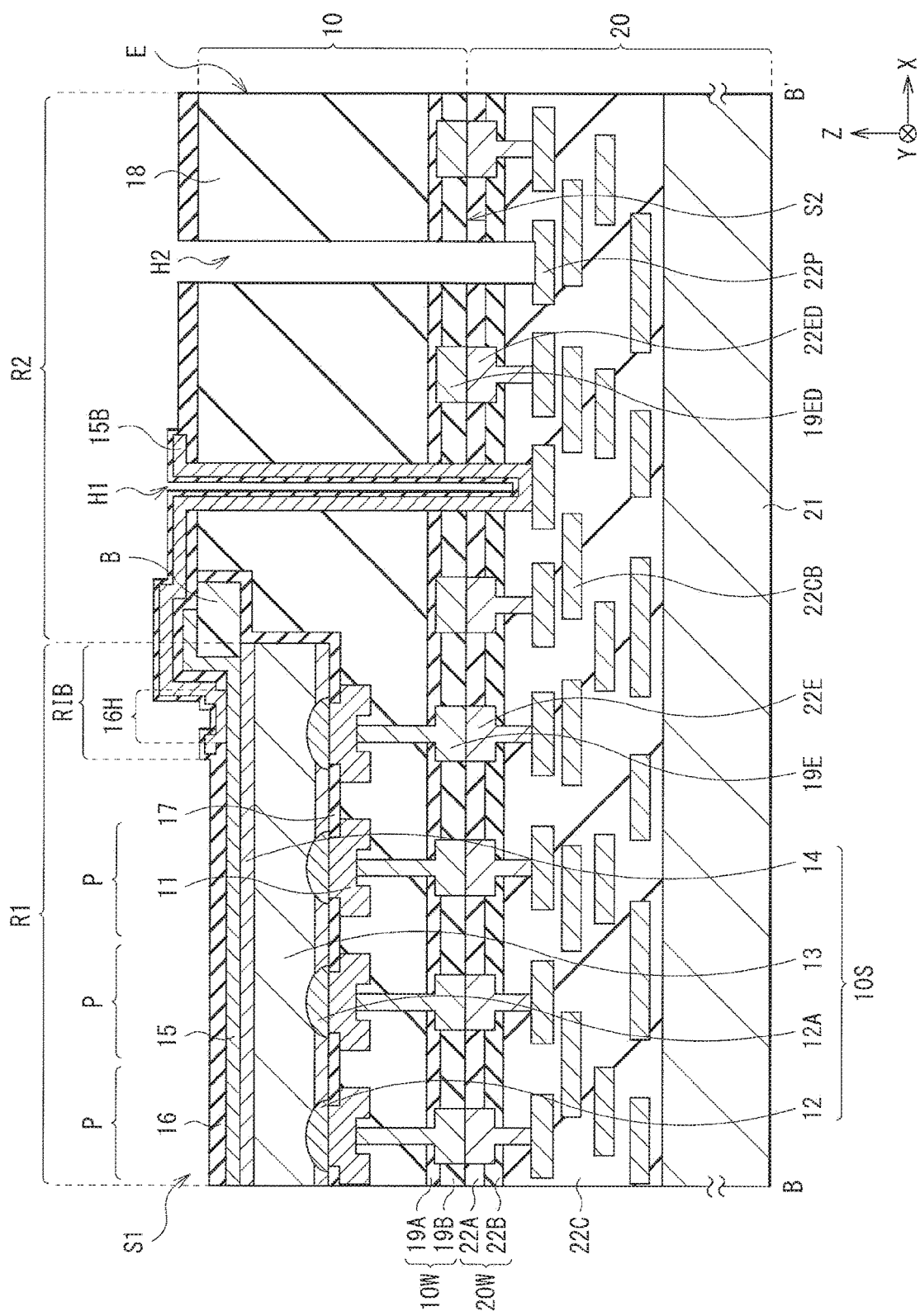
FIG. 1B is a schematic view of a cross-sectional configuration along line B-B' in FIG. 1A.

FIGS. 1A and 1B illustrate a schematic configuration of a semiconductor device (a light-receiving device 1) according to a first embodiment of the present disclosure. FIG. 1A illustrates a planar configuration of the light-receiving device 1, and FIG. 1B illustrates a cross-sectional configuration along line B-B' in FIG. 1A. The light-receiving device 1 is applied to an infrared sensor or the like in which a compound semiconductor material such as a group III-V semiconductor is used, for example. The light-receiving device 1 has a photoelectric conversion function for light of a wavelength ranging from a visible region (e.g., 380 nm or more and less than 780 nm) to a short-infrared region (e.g., 780 nm or more and less than 2400 nm), for example. The light-receiving device 1 includes a plurality of light-receiving unit regions P (pixels P) that are two-dimensionally disposed, for example (FIG. 1B).

The light-receiving device 1 includes a device region R1 in a central portion, and a peripheral region R2 provided outside the device region R1 and surrounding the device region R1 (FIG. 1A). The light-receiving device 1 includes an electrically-conductive film 15B provided from the device region R1 to the peripheral region R2. The electrically-conductive film 15B has an opening in a region opposed to a central portion of the device region R1.

Figure 13:
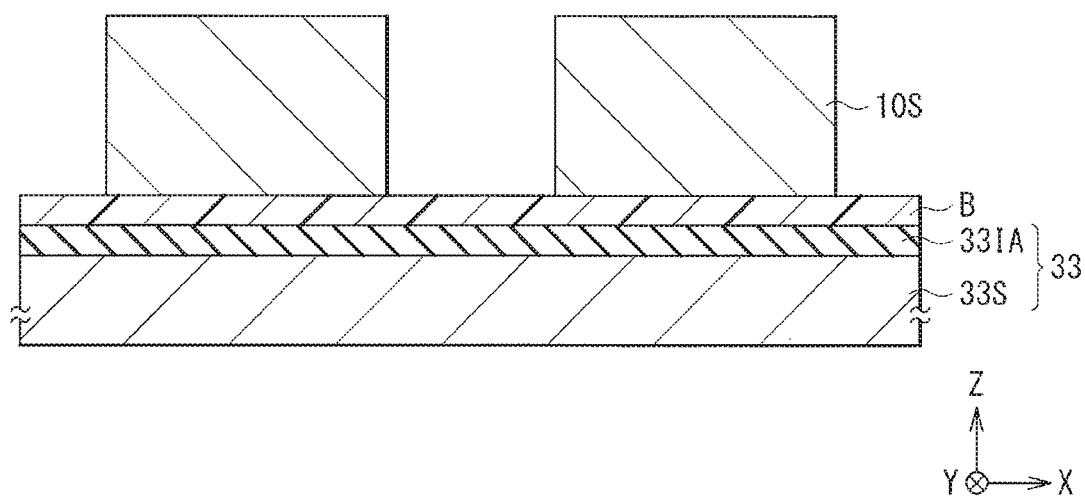
FIG. 13 is a schematic cross-sectional view of another example (2) of the process illustrated in FIG. 8B.

The light-receiving device 1 has a stacked structure of a device substrate 10 and a readout circuit substrate 20 (FIG. 13). One surface of the device substrate 10 serves as a light incident surface (a light incident surface S1), and a surface opposite to the light incident surface S1 (the other surface) serves as a junction surface with the readout circuit substrate 20 (a junction surface S2).

The device substrate 10 includes a wiring layer 10W, a first electrode 11, a semiconductor layer 10S (a first semiconductor layer), a second electrode 15, and a passivation film 16 that are provided in this order from a position close to the readout circuit substrate 20. A surface, facing the wiring layer 10W, and an end surface (a side surface) of the semiconductor layer 10S are covered with an insulating film 17. The readout circuit substrate 20, which is a so-called readout integrated circuit (ROIC), includes a wiring layer 20W, a multi-layered wiring layer 22C, and a semiconductor substrate 21. The wiring layer 20W and the multi-layered wiring layer 22C are in contact with the junction surface S2 of the device substrate 10. The semiconductor substrate 21 faces the device substrate 10 with the wiring layer 20W and the multi-layered wiring layer 22C in between.

The device substrate 10 includes the semiconductor layer 10S in the device region R1. In other words, a region in which the semiconductor layer 10S is provided is the device region R1 of the light-receiving device 1. In the device region R1, a region exposed from the electrically-conductive film 15B (a region opposed to the opening of the electrically-conductive film 153) is a light-receiving region. In the device region R1, a region covered with the electrically-conductive film 153 is an optical black (OPB) region R1B. The OPB region R1B is provided to surround the light-receiving region. The OPB region R1B is used to obtain a black-level pixel signal. The device substrate 10 includes a buried layer 18 together with the insulating film 17 in the peripheral region R2. The peripheral region R2 is provided with holes H1 and H2 penetrating through the device substrate 10 to reach the readout circuit substrate 20. In the light-receiving device 1, light enters the semiconductor layer 10S from the light incident surface S1 of the device substrate 10 through the passivation film 16, the second electrode 15, and a second contact layer 14. Signal charges having subjected to photoelectric conversion in the semiconductor layer 10S migrate and are read by the readout circuit substrate 20 through the first electrode 11 and the wiring layer 10W. Configurations of respective components are described below.

The wiring layer 10W is provided over the device region R1 and the peripheral region R2, and has the junction surface S2 with the readout circuit substrate 20. In the light-receiving device 1, the junction surface S2 of the device substrate 10 is provided in the device region R1 and the peripheral region R2, and the junction surface S2 of the device region R1 and the junction surface S2 of the peripheral region R2 are flush with each other, for example. In the light-receiving device 1, the buried layer 18 is provided to form the junction surface S2 of the peripheral region R2, as described later.

The wiring layer 10W includes, for example, a contact electrode 19E and a dummy electrode 19ED in interlayer insulating films 19A and 19B. For example, the interlayer insulating film 19B is disposed on side on which the readout circuit substrate 20 is located, and the interlayer insulating film 194 is disposed on side on which a first contact layer 12 is located. The interlayer insulating films 19A and 19B are stacked. The interlayer insulating films 19A and 19B include, for example, an inorganic insulating material. Examples of the inorganic insulating material include silicon nitride (SiN), aluminum oxide ($Al_2O_3$), silicon oxide ($SiO_2$), hafnium oxide ($HfO_2$), and the like. The interlayer insulating films 19A and 19B may include an identical inorganic insulating material.

The contact electrode 19E is provided in, for example, the device region R1. The contact electrode 19E serves to allow the first electrode 11 and the readout circuit substrate 20 to be electrically coupled to each other, and is provided for each of the pixels P in the device region R1. The mutually-adjacent contact electrodes 19E are electrically separated from each other by the buried layer 18 and the interlayer insulating films 19A and 19B. The contact electrode 19E is configured of, for example, a copper (Cu) pad, and is exposed to the junction surface S2. The dummy electrode 19ED is provided in, for example, the peripheral region R2. The dummy electrode 19ED is coupled to a dummy electrode 22ED of the wiring layer 20W to be described later. Providing the dummy electrode 19ED and the dummy electrode 22ED makes it possible to improve strength of the peripheral region R2. The dummy electrode 19ED is formed in the same process as a process of forming the contact electrode 19E, for example. The dummy electrode 19ED is configured of, for example, a copper (Cu) pad, and is exposed to the junction surface S2.

The first electrode 11 provided between the contact electrode 19E and the semiconductor layer 10S is an electrode (an anode) to which a voltage directed to reading out of signal charges generated in a photoelectric conversion layer 13 is supplied, and is provided for each of the pixels P in the device region R1. (The signal charges are holes or electrons. In the following, the signal charges are described as being the holes for description purpose.) The first electrode 11 is provided to be buried in an opening of the insulating film 17, and is in contact with the semiconductor layer 10S (more specifically, a diffusion region 12A to be described later). The first electrode 11 is larger than the opening of the insulating film 17, for example, and is partially provided in the buried layer 18. In other words, a top surface (a surface on side on which the semiconductor layer 10S is located) of the first electrode 11 is in contact with the diffusion region 12A, and a bottom surface and a portion of a side surface of the first electrode 11 are in contact with the buried layer 18. The mutually-adjacent first electrodes 11 are electrically separated from each other by the insulating film 17 and the buried layer 18.

The first electrode 11 includes a simple substance selected from, for example, titanium (Ti), tungsten (W), titanium nitride (TiN), platinum (Pt), gold (Au), germanium (Ge), palladium (Pd), zinc (Zn), nickel (Ni), and aluminum (Al). Alternatively, the first electrode 11 includes an alloy that contains one or more of the above-described simple substances. The first electrode 11 may be a single film configured by any of the above-described materials configuring the first electrode 11, or may be a laminated film having a combination of two or more of the above-described materials. In one example, the first electrode 11 is a laminated film that includes a titanium film and a tungsten film. The first electrode 11 has a thickness of, for example, several tens of nanometers to several hundreds of nanometers.

The semiconductor layer 10S includes, for example, the first contact layer 12, the photoelectric conversion layer 13, and the second contact layer 14 that are provided in this order from a position close to the wiring layer 10W. The first contact layer 12, the photoelectric conversion layer 13, and the second contact layer 14 have the same planar shape as one another, and an end surface of the first contact layer 12, an end surface of the photoelectric conversion layer 13, and an end surface of the second contact layer 14 are disposed at the same position in a plan view The first contact layer 12 is, for example, provided common to all of the pixels P, and is disposed between the insulating film 17 and the photoelectric conversion layer 13. The first contact layer 12 serves to electrically separate the mutually-adjacent pixels P from each other, and has a plurality of diffusion regions 12A, for example. Using, for the first contact layer 12, a compound semiconductor material having a larger band gap than a band gap of a compound semiconductor material configuring the photoelectric conversion layer 13 makes it possible to suppress a dark current. The first contact layer 12 may include, for example, n-type Indium phosphide (InP).

The diffusion regions 12A provided in the first contact layer 12 are separated from one another. One of the diffusion regions 12A is provided for each of the pixel P, and the first electrode 11 is coupled to corresponding one of the diffusion regions 12A. The diffusion regions 12A are also provided in the OPB region R1B. Each of the diffusion regions 12A serves to read, from corresponding one of the pixels P, signal charges generated in the photoelectric conversion layer 13, and includes, for example, a p-type impurity. Examples of the p-type impurity include zinc (Zn) and the like. Thus, a p-n junction interface is formed between the diffusion regions 12A and the first contact layer 12 other than the diffusion regions 12A, and the mutually-adjacent pixels P are electrically separated from each other. Each of the diffusion regions 12A is provided, for example, in a thickness direction of the first contact layer 12, and is also provided in a portion in the thickness direction of the photoelectric conversion layer 13.

The photoelectric conversion layer 13 provided between the first electrode 11 and the second electrode 15, more specifically between the first contact layer 12 and the second contact layer 14 is provided common to all of the pixels P, for example. The photoelectric conversion layer 13 absorbs light of a predetermined wavelength to thereby generate signal charges, and includes, for example, a compound semiconductor material such as an i-type group III-V semiconductor. Examples of the compound semiconductor material configuring the photoelectric conversion layer 13 include indium gallium arsenide (InGaAs), indium arsenide antimonide (InAsSb), indium arsenide (InAs), indium antimonide (InSb), mercury cadmium telluride (HgCdTe), and the like. Alternatively, the photoelectric conversion layer 13 may include germanium (Ge). The photoelectric conversion layer 13 performs photoelectric conversion on, for example, light of a wavelength ranging from a visible region to a short-infrared region.

The second contact layer 14 is provided common to all of the pixels P, for example. The second contact layer 14 is provided between the photoelectric conversion layer 13 and the second electrode 15, and is in contact with the photoelectric conversion layer 13 and the second electrode 15. The second contact layer 14 serves as a region in which electrical charges discharged from the second electrode 15 migrate, and includes a compound semiconductor that includes, for example, an n-type impurity. The second contact layer 14 may include, for example, n-type indium phosphide (InP).

The second electrode 15 serves as an electrode common to each of the pixels P, for example. The second electrode 15 is so provided on the second contact layer 14 (on light-incident side) as to be in contact with the second contact layer 14. The second electrode 15 (a cathode) serves to discharge electrical charges unused as the signal charges among the electrical charges generated in the photoelectric conversion layer 13. For example, it is possible to discharge electrons, for example, through the second electrode 15 in a case where the holes are to be read from the first electrode 11 as the signal charges. The second electrode 15 is, for example, an electrically-conductive film that allows for transmission of incident light such as infrared light. The second electrode 15 may include, for example, indium tin oxide (ITO), ITiO ($In_2O_3$—$TiO_2$), or the like. The second electrode 15 may be provided in a grid shape to define mutually-adjacent pixels P, for example. It is possible to use an electrically-conductive material with low light-transmitting properties for the second electrode 15.

The passivation film 16 covers the second electrode 15 from side on which the light incident surface S1 is located. The passivation film 16 may have an anti-reflection function. The passivation film 16 may include, for example, silicon nitride (SiN), aluminum oxide ($Al_2O_3$), silicon oxide ($SiO_2$), tantalum oxide ($Ta_2O_3$), or the like. The passivation film 16 has an opening 16H in the OPB region R1B. The opening 16H is provided in a frame shape surrounding the light-receiving region, for example (FIG. 1A) The opening 16H may be, for example, a quadrangular or circular hole in a plan view. The opening 16H of the passivation film 16 allows the electrically-conductive film 15B to be electrically coupled to the second electrode 15.

The insulating film 17 is provided between the first contact layer 12 and the buried layer 18, and covers an end surface of the first contact layer 12, an end surface of the photoelectric conversion layer 13, an end surface of the second contact layer 14, and an end surface of the second electrode 15. The insulating film 17 is in contact with the passivation film 16 in the peripheral region R2. The insulating film 17 includes, for example, an oxide such as silicon oxide ($SiO_x$) and aluminum oxide ($Al_2O_3$). The insulating film 17 may have a stacked structure that includes a plurality of films. Alternatively, the insulating film 17 may include, for example, a silicon (Si)-based insulating material, such as silicon oxynitride (SiON), silicon oxycarbide (SiOC), silicon nitride (SiN), and silicon carbide (SiC). The insulating film 17 has a thickness of, for example, several tens of nanometers to several hundreds of nanometers.

The electrically-conductive film 15B is provided from the OPB region R1B to the hole H1 in the peripheral region R2. The electrically-conductive film 15B is in contact with the second electrode 15 in the opening 16H of the passivation film 16 provided in the OPB region R1B, and is in contact with a wiring line (a wiring line 22CB to be described later) of the readout circuit substrate 20 through the hole H1. This causes a voltage to be supplied from the readout circuit substrate 20 to the second electrode 15 through the electrically-conductive film 15B. The electrically-conductive film 15B functions as such a path for supplying a voltage to the second electrode 15, and also functions as a light-blocking film to form the OPB region R1B. The electrically-conductive film 15B includes, for example, a metallic material including tungsten (W), aluminum (Al), titanium (Ti), molybdenum (Mo), tantalum (Ta), or copper (Cu). A passivation film may be provided on the electrically-conductive film 15B.

An adhesive layer B may be provided between an end portion of the second contact layer 14 and the second electrode 15. The adhesive layer B is used in forming the light-receiving device 1 as described later, and serves to bond the semiconductor layer 10S to a temporary substrate (a temporary substrate 33 in FIG. 4C to be described later). The adhesive layer B includes, for example, tetraethoxysilane (TEOS), silicon oxide ($SiO_2$), or the like. The adhesive layer B is provided wider than the end surface of the semiconductor layer 10S and is covered with the buried layer 18, together with the semiconductor layer 10S. The insulating film 17 is provided between the adhesive layer B and the buried layer 18.

Figure 2:
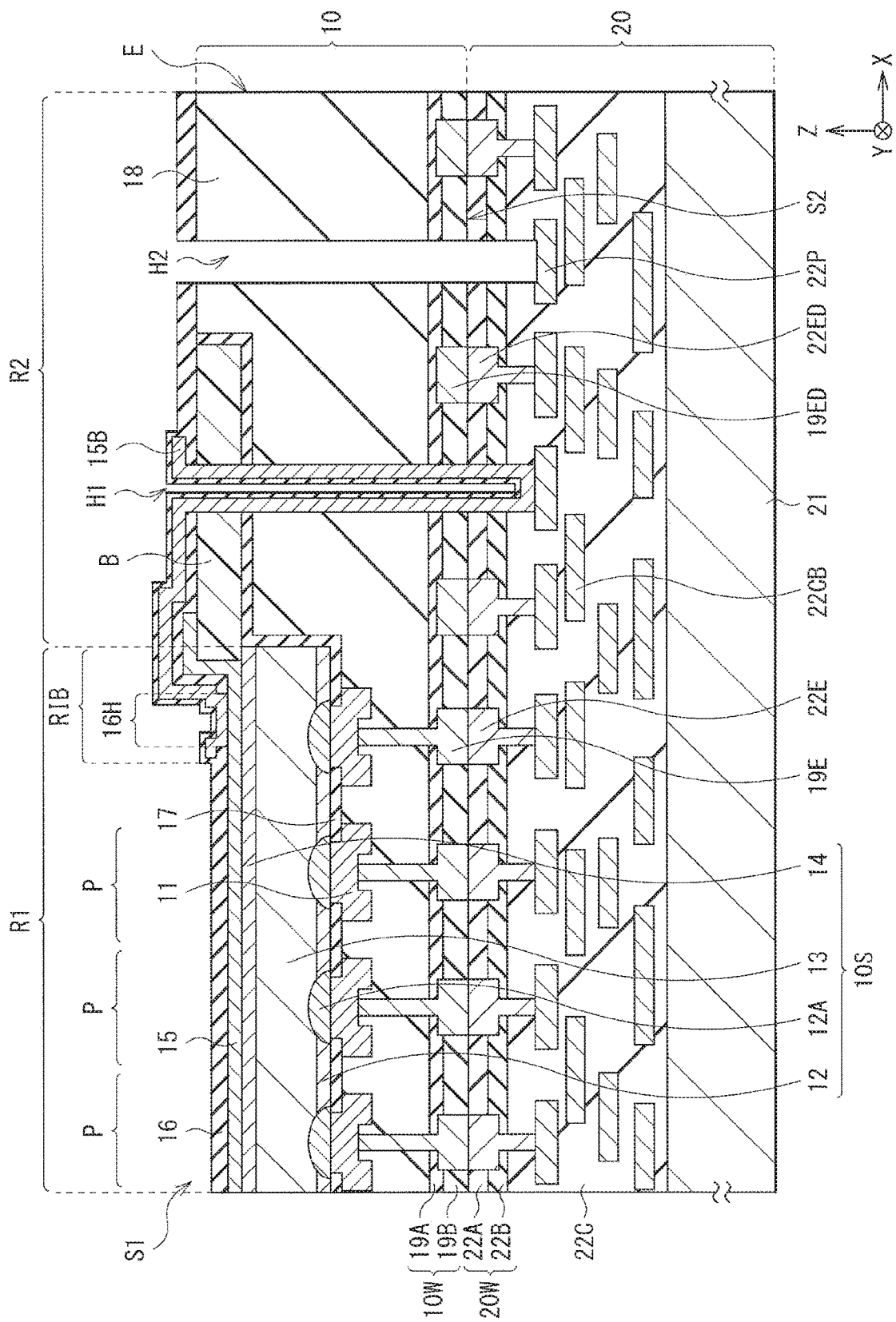
FIG. 2 is a schematic cross-sectional view of another example (1) of a configuration of an adhesive layer illustrated in FIG. 1B.

FIGS. 2 and 3 illustrate other examples of a configuration of the adhesive layer B. The adhesive layer B may be provided over a broad region of the peripheral region R2; for example, the adhesive layer B may extend from the vicinity of an edge of the semiconductor layer 10S (the device region R1) to a space between the hole H1 and the hole H2 (FIG. Alternatively, the adhesive layer B may extend from the vicinity of the edge of the semiconductor layer 10S (the device region R1) to a chip end (a chip end E).

The buried layer 18 serves to fill a level difference between the semiconductor layer 10S and a temporary substrate (the temporary substrate 33 in FIG. 4C to be described later) in manufacturing processes of the light-receiving device 1. In the present embodiment, providing the buried layer 18 suppresses occurrence of a defect in the manufacturing processes resulting from the level difference between the semiconductor layer 10S and the temporary substrate 33, as described later.

The buried layer 18 in the peripheral region R2 is provided between the wiring layer 10W and the insulating film 17 and between the wiring layer 10W and the passivation film 16, and has, for example, a thickness equal to or larger than a thickness of the semiconductor layer 10S. In this case, the buried layer 18 is provided so as to surround the semiconductor layer 10S, thereby forming a region (the peripheral region R2) around the semiconductor layer 10S. This makes it possible to provide the junction surface S2 with the readout circuit substrate 20 in the peripheral region R2. In a case where the junction surface S2 is provided in the peripheral region R2, the thickness of the buried layer 18 may be reduced; however, the buried layer 18 preferably covers the semiconductor layer 10S in the thickness direction and preferably covers the entire end surface of the semiconductor layer 10S. Covering the entire end surface of the semiconductor layer 10S with the buried layer 18 with the insulating film 17 in between makes it possible to effectively suppress entry of water into the semiconductor layer 10S. The buried layer 18 in the device region R1 is provided between the semiconductor layer 10S and the wiring layer 10W to cover the first electrode 11.

A surface, on side on which the junction surface S2 is located, of the buried layer 18 is planarized, and in the peripheral region R2, the wiring layer 10W is provided on the planarized surface of the buried layer 18. The buried layer 18 may include, for example, an inorganic insulating material such as silicon oxide ($SiO_x$), silicon nitride (SiN), silicon oxynitride (SiON), silicon oxycarbide (SiOC), and silicon carbide (SiC).

Figure 14A:
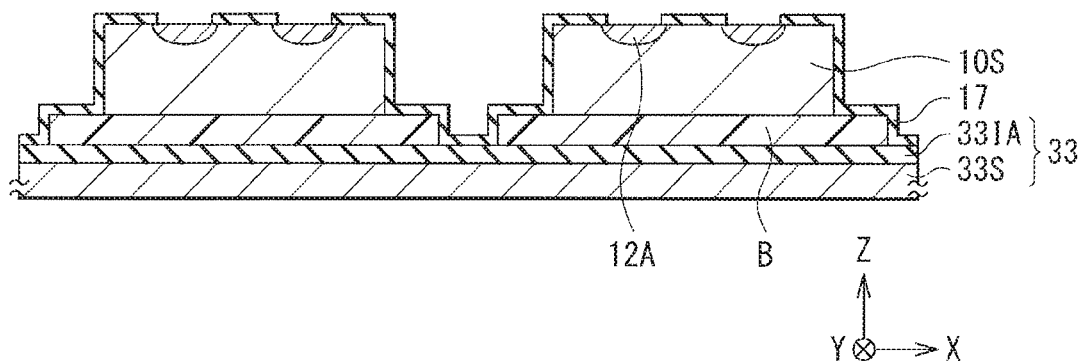
FIG. 14A is a schematic cross-sectional view of a process following the process illustrated in FIG. 8B.
Figure 14B:
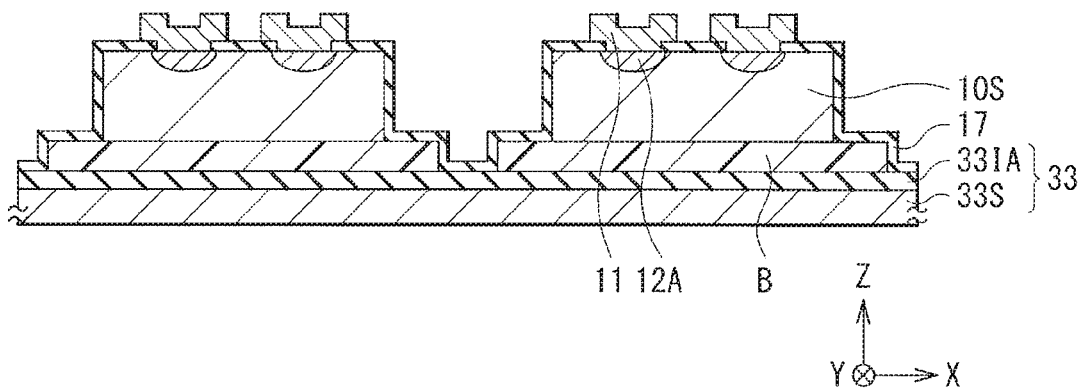
FIG. 14B is a schematic cross-sectional view of a process following the process illustrated in FIG. 14A.
Figure 14C:
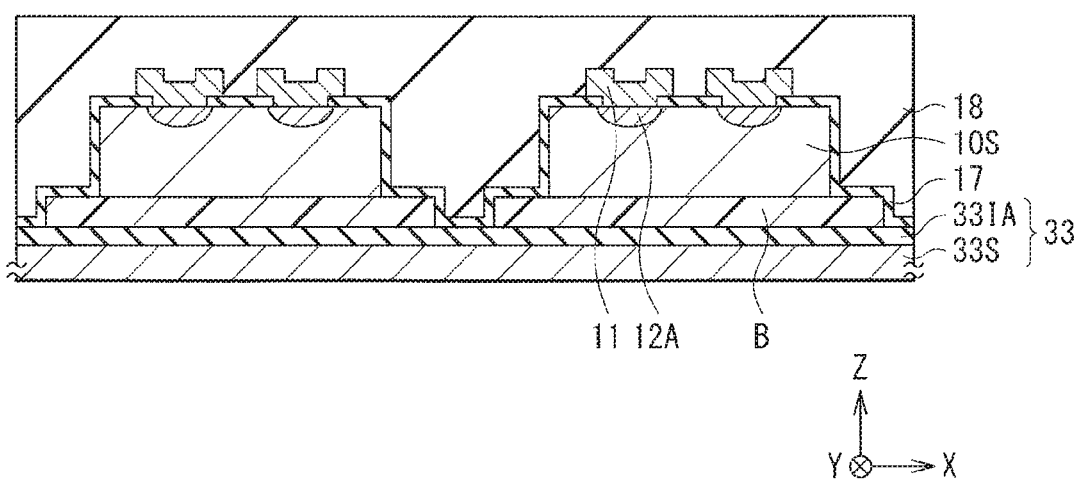
FIG. 14C is a schematic cross-sectional view of a process following the process illustrated in FIG. 14B.
Figure 14D:
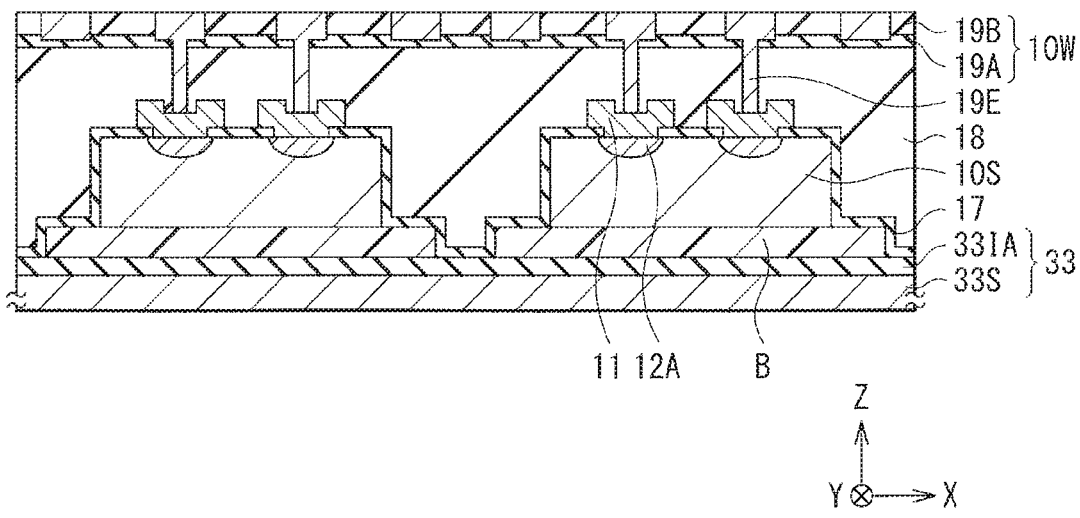
FIG. 14D is a schematic cross-sectional view of a process following the process illustrated in FIG. 14C.

In the manufacturing processes of the light-receiving device 1, after the formation of the buried layer 18, the wiring layer 10W including the interlayer insulating films 19A and 19B and the contact electrode 19E is formed above the buried layer 18, as described later (FIG. 14D to be described later). The readout circuit substrate 20 including the wiring layer 20W is bonded to the device substrate 10 including the wiring layer 10W (FIG. 14E to be described later); thus, the light-receiving device 1 is formed, At this occasion, the contact electrode 19E of the wiring layer 10W and the contact electrode 22E of the wiring layer 20W are coupled to each other. The contact electrodes 19E and 22E each include a Cu pad, for example, and direct bonding between the Cu pads causes the contact electrodes 19E and 22E to be coupled to each other. In forming the contact electrode 19E by a chemical mechanical polishing (CMP) method, it is demanded that the buried layer 18 disposed below a copper film to be polished have enough hardness to withstand stress during polishing. Moreover, for direct bonding between the Cu pads of the contact electrodes 19E and 22E, the device substrate 10 and the readout circuit substrate 20 have to be formed extremely planarized. Therefore, the buried layer 18 disposed below the copper film preferably has enough hardness to withstand stress during polishing. Specifically, a material configuring the buried layer 18 preferably has higher hardness than a sealant or an organic material that is disposed around a die in a typical semiconductor package. Examples of a material having such a high hardness include an inorganic insulating material. Forming a film of the inorganic insulating material by a chemical vapor deposition (CVD) method, a sputtering method, or a coating method, for example, makes it possible to form the buried layer 18.

The buried layer 18 is provided with the holes H1 and H2 penetrating through the buried layer 18. The holes H1 and H2 penetrate through the wiring layer 10W as well as the buried layer 18 to reach the readout circuit substrate 20. The holes H1 and H2 each have a quadrangular planar shape, for example, and a plurality of holes H1 and a plurality of holes H2 are provided to surround the device region R1 (FIG. 1A). The hole H1 is provided at a position closer to the device region R1 than the hole H2 is, and a sidewall and a bottom surface of the hole H1 are covered with the electrically-conductive film 15B. The hole H1 allows the second electrode 15 (the electrically-conductive film 15B) and a wiring line (the wiring line 22CB to be described later) of the readout circuit substrate 20 to be coupled to each other, and is provided to penetrate through the passivation film 16, the buried layer 18, and the wiring layer 10W.

The hole H2 is provided at a position closer to the chip end E than the hole H1 is, for example. The hole H2 penetrates through the passivation film 16, the buried layer 18, and the wiring layer 10W to reach a pad electrode (a pad electrode 22P to be described later) of the readout circuit substrate 20. Through the hole H2, the light-receiving device 1 is electrically coupled to outside. The holes H1 and H2 need not reach the readout circuit substrate 20. For example, the holes H1 and H2 may reach a wiring line of the wiring layer 10W, and the wiring line may be coupled to the wiring line 22CB and the pad electrode 22P of the readout circuit substrate 20. The holes H1 and H2 may penetrate through the adhesive layer B (FIGS. 2 and 3).

Holes and electrons generated in the photoelectric conversion layer 13 are read from the first electrode 11 and the second electrode 15. To perform the readout operation at high speed, a distance between the first electrode 11 and the second electrode 15 is preferably a distance that is enough for photoelectric conversion and is not too large a separation distance. In other words, the device substrate 10 preferably has a small thickness. For example, the distance between the first electrode 11 and the second electrode 15 or the thickness of the device substrate 10 is 10 μm or less, further 7 μm or less, and further 5 μm or less.

The semiconductor substrate 21 of the readout circuit substrate 20 faces the device substrate 10 with the wiring layer 20W and the multi-layered wiring layer 22C in between. The semiconductor substrate 21 includes, for example, silicon (Si). A plurality of transistors is provided in the vicinity of a surface (a surface on side on which the wiring layer 20W is located) of the semiconductor substrate 21. For example, the plurality of transistors configures a readout circuit for each of the pixels P. The wiring layer 20W includes, for example, an interlayer insulating film 22A and an interlayer insulating film 22B that are stacked in this order from side on which the device substrate 10 is located. For example, in the interlayer insulating film 22A is provided the contact electrode 22E and the dummy electrode 22ED. The multi-layered wiring layer 22C is provided to face the device substrate 10 with the wiring layer 20W in between. For example, in the multi-layered wiring layer 22C is provided the pad electrode 22P and a plurality of wiring lines 22CB. The interlayer insulating films 22A and 22B include, for example, an inorganic insulating material. Examples of the inorganic insulating material include silicon nitride (SiN), aluminum oxide ($Al_2O_3$), silicon oxide ($SiO_2$), hafnium oxide ($HfO_2$), and the like.

The contact electrode 22E serves to allow the first electrode 11 and the wiring line 22CB to be electrically coupled to each other, and is provided for each of the pixels P in the device region R1. The contact electrode 22E is in contact with the contact electrode 19E on the junction surface S2 of the device substrate 10. The mutually-adjacent contact electrodes 22E are electrically separated from each other by the interlayer insulating film 22A.

The dummy electrode 22ED provided in the peripheral region R2 is in contact with the dummy electrode 19ED on the junction surface S2 of the device substrate 10. The dummy electrode 22ED is formed in the same process as a process of forming the contact electrode 22E, for example. Each of the contact electrode 22E and the dummy electrode 22ED is configured of, for example, a copper (Cu) pad, and is exposed to a surface, facing the device substrate 10, of the readout circuit substrate 20. In other words, for example, Cu—Cu bonding is achieved between the contact electrode 19E and the contact electrode 22E and between the dummy electrode 19ED and the dummy electrode 22ED. This enables the pixels P to be downsized as described later.

The wiring line 22CB coupled to the contact electrode 19E is coupled to a transistor provided in the vicinity of the surface of the semiconductor substrate 21, and the first electrode 11 and a readout circuit are coupled to each other for each of the pixels P. The wiring line 22CB coupled to the electrically-conductive film 15B through the hole H1 is coupled to, for example, a predetermined potential. Thus, one of the electrical charges generated in the photoelectric conversion layer 13 (e.g., holes) are read from the first electrode 11 to the readout circuit through the contact electrodes 19E and 22E, and the other of the electrical charges generated in the photoelectric conversion layer 13 (e.g., electrons) are discharged from the second electrode 15 to a predetermined potential through the electrically-conductive film 15B.

The pad electrode 22P provided in the peripheral region R2 is provided to be electrically coupled to outside. The light-receiving device 1 is provided with, in the vicinity of the chip end E, the hole H2 that penetrates through the device substrate 10 to reach the pad electrode 22P, and the pad electrode 22P is electrically coupled to outside through the hole H2. Such coupling is, for example, implemented by any of methods such as wire bonding and a bump. For example, a predetermined potential may be supplied from an external terminal disposed in the hole H2 to the second electrode 15 through the hole H2, the wiring line 22CB of the readout circuit substrate 20, and the electrically-conductive film 15B. As a result of photoelectric conversion in the photoelectric conversion layer 13, a signal voltage read from the first electrode 11 may be read to the readout circuit of the semiconductor substrate 21 through the contact electrodes 19E and 22E, and may be outputted to the external terminal disposed in the hole H2 via the readout circuit. The signal voltage may be outputted to the external terminal via another circuit included in the readout circuit substrate 20, for example, as well as the readout circuit. Examples of the other circuit include a signal processing circuit, an output circuit, and the like.

The readout circuit substrate 20 preferably has a thickness larger than a thickness of the device substrate 10. For example, the thickness of the readout circuit substrate 20 is preferably twice or more, further preferably five times or more, and further preferably ten times or more as large as the thickness of the device substrate 10. Alternatively, the thickness of the readout circuit substrate 20 is, for example, 100 µm or more, 150 µm or more, or 200 µm or more. The readout circuit substrate 20 having such a large thickness enables mechanical strength of the light-receiving device 1 to be secured. It is to be noted that the readout circuit substrate 20 may include only one layer of the semiconductor substrate 21 forming a circuit, or may further include a substrate such as a support substrate in addition to the semiconductor substrate 21 forming a circuit.

Method of Manufacturing Light-receiving Device 1

The light-receiving device 1 may be manufactured in the following manner, for example. FIGS. 4A to 14J illustrate manufacturing processes of the light-receiving device 1 in order of processes.

Figure 4A:
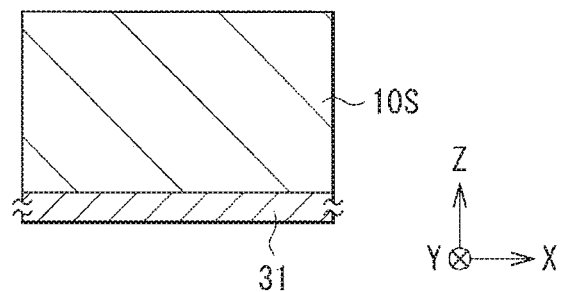
FIG. 4A is a schematic cross-sectional view that describes a process of a method of manufacturing the light-receiving device illustrated in FIG. 1.
Figure 4B:
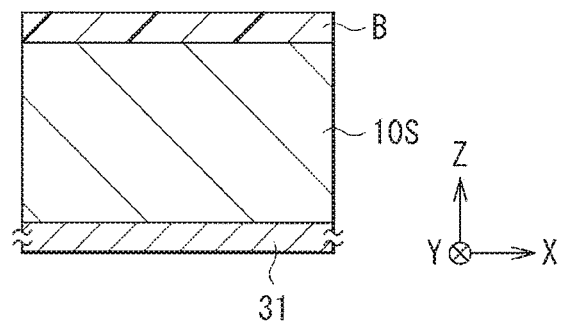
FIG. 4B is a schematic cross-sectional view of a process following the process illustrated in FIG. 4A.

First, the semiconductor layer 10S is epitaxially grown on a growth substrate 31 including, for example, InP, as illustrated in FIG. 4A. The growth substrate 31 has a thickness of several hundreds of micrometers, for example, and the semiconductor layer 10S has a thickness of several micrometers, for example. Thereafter, the adhesive layer B is formed on the semiconductor layer 10S, as illustrated in FIG. 4B. A diameter of the growth substrate 31 is, for example, 6 inches or less. The semiconductor layer 10S is formed, for example, by epitaxially growing n-type InP configuring the first contact layer 12, i-type InGaAs configuring the photoelectric conversion layer 13, and n-type InP configuring the second contact layer 14 in this order. A buffer layer and a stopper layer may be formed on the growth substrate 31, for example, and thereafter, the semiconductor layer 10S may be formed on the growth substrate 31.

Figure 4C:
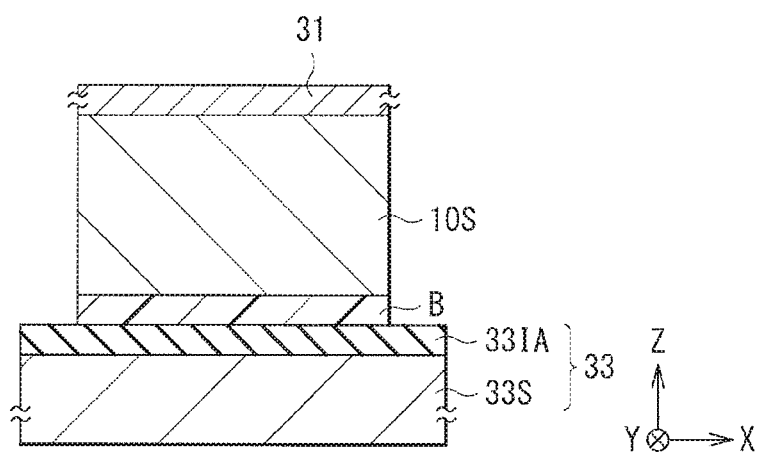
FIG. 4C is a schematic cross-sectional view of a process following the process illustrated in FIG. 4B.

Next, the growth substrate 31 provided with the semiconductor layer 10S is bonded to the temporary substrate 33 with the adhesive layer B in between, as illustrated in FIG. 4C, The temporary substrate 33 includes, for example, an insulating layer (an insulating layer 33IA) and a substrate 33S. The insulating layer 33IA is disposed between the adhesive layer B and the substrate 33S, for example. As the temporary substrate 33, a substrate having a larger diameter than the diameter of the growth substrate 31 is used, and a silicon (Si) substrate is used as the substrate 33S, for example. The diameter of the temporary substrate 33 is, for example, in a range from 8 inches to 12 inches. Bonding the growth substrate 31 having a small diameter to the temporary substrate 33 having a large diameter makes it possible to use various apparatuses for a large-diameter substrate for formation of the device substrate 10. This makes it possible to use, for example, Cu—Cu bonding for bonding of the readout circuit substrate 20 and the device substrate 10 and to downsize the pixels P. Alternatively, the growth substrate 31 may be bonded to the temporary substrate 33 by plasma activation bonding, room-temperature bonding, bonding using an adhesive (adhesive bonding), or the like. Thus, for example, the wafer-shaped semiconductor layer 10S is bonded to the temporary substrate 33. The temporary substrate 33 has a thickness of, for example, several hundreds of micrometers.

Figure 5:
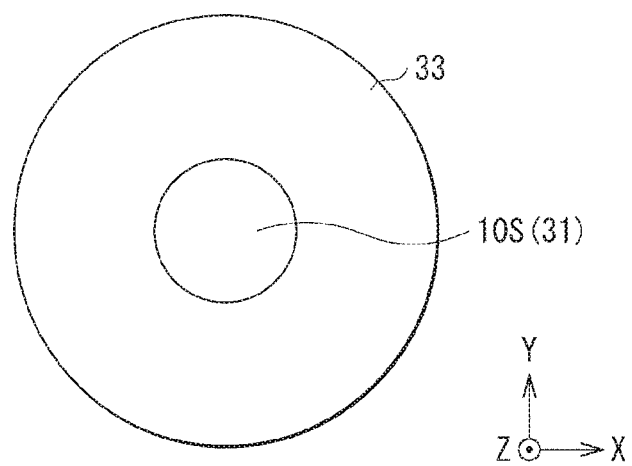
FIG. 5 is a schematic plan view of an example of the process illustrated in FIG. 4C.
Figure 6:
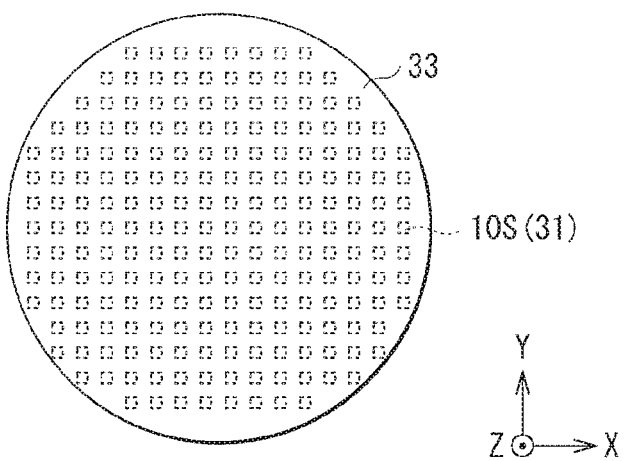
FIG. 6 is a schematic plan view of another example (1) of a configuration of a semiconductor layer illustrated in FIG. 5.

FIGS. 5 and 6 illustrate examples of a planar configuration of the temporary substrate 33 and the semiconductor layer 10S (the growth substrate 31). The wafer-shaped semiconductor layer 10S that is smaller than the temporary substrate 33 may be bonded to the wafer-shaped temporary substrate 33 (FIG. 5), or a plurality of chip-shaped semiconductor layers 10S may be bonded to the wafer-shaped temporary substrate 33, being separated from one another (FIG. 6).

Figure 7A:
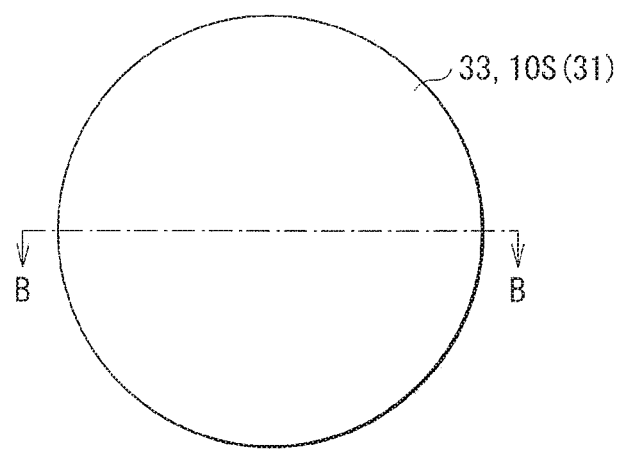
FIG. 7A is a schematic plan view of another example (2) of a configuration of the semiconductor layer illustrated in FIG. 5.
Figure 7B:
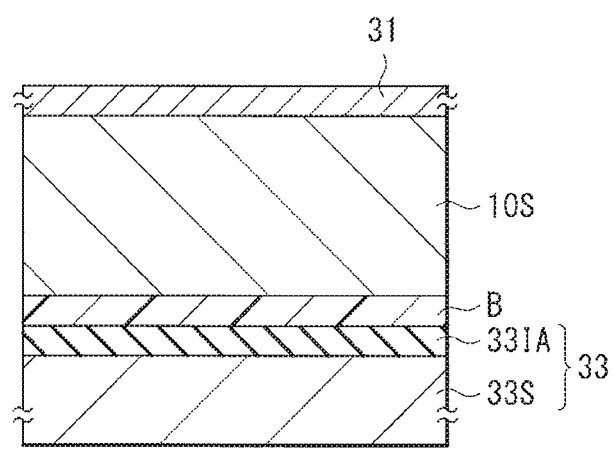
FIG. 7B is a schematic view of a cross-sectional configuration along line B-B illustrated in FIG. 7A.

Alternatively, the wafer-shaped semiconductor layer 10S that has the same size as the temporary substrate 33 may be bonded to the water-shaped temporary substrate 33, as illustrated in FIGS. 7A and 7B. FIG. 7A illustrates a planar configuration of the temporary substrate 33 and the semiconductor layer 10S (the growth substrate 31), and FIG. 7B illustrates a cross-sectional configuration along line B-B in FIG. 7A.

Figure 8A:
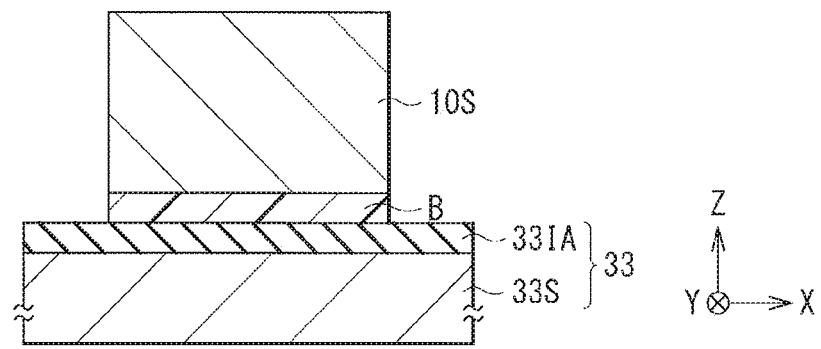
FIG. 8A is a schematic cross-sectional view of a process following the process illustrated in FIG. 4C.

After bonding, to the temporary substrate 33, the growth substrate 31 provided with the semiconductor layer 10S, the growth substrate 31 is removed, as illustrated in FIG. 8A. The growth substrate 31 may be removed by mechanical polishing, chemical mechanical polishing (CMP), wet etching, dry etching, or the like. At this occasion, the growth substrate 31 may partially remain. Moreover, the semiconductor layer 10S may partially be etched.

Figure 8B:
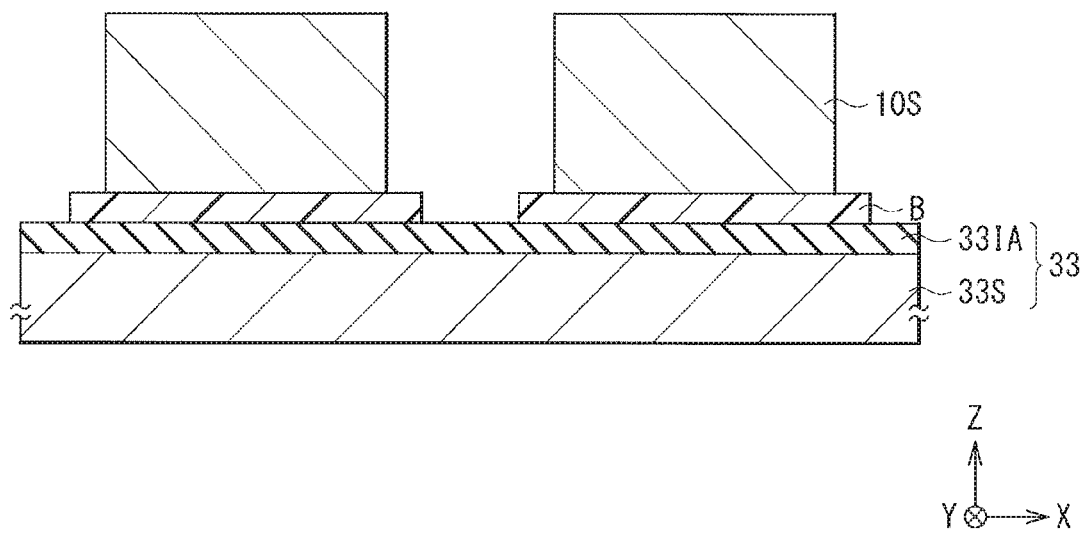
FIG. 8B is a schematic cross-sectional view of a process following the process illustrated in FIG. 8A.

Subsequently, the semiconductor layer 10S is etched into a predetermined size with reference to a mark on the temporary substrate 33, for example, as illustrated in FIG. 8B. Thus, the plurality of chip-shaped semiconductor layers 10S is formed. FIG. 8B and subsequent drawings illustrate two semiconductor layers 10S among the plurality of chip-shaped semiconductor layers 10S.

Figure 9A:
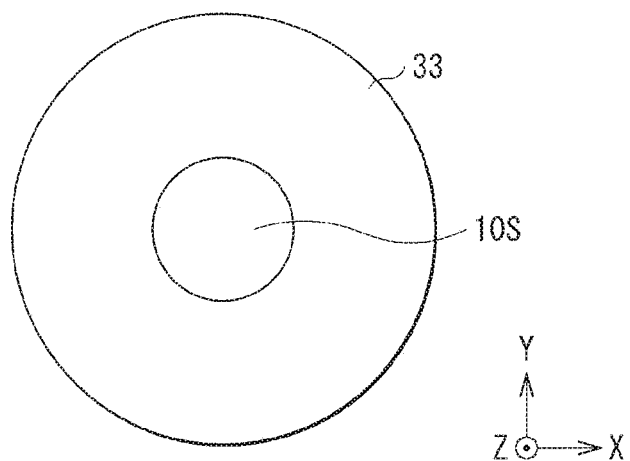
FIG. 9A is a schematic view of an example of a planar configuration of the process illustrated in FIG. 8A.
Figure 9B:
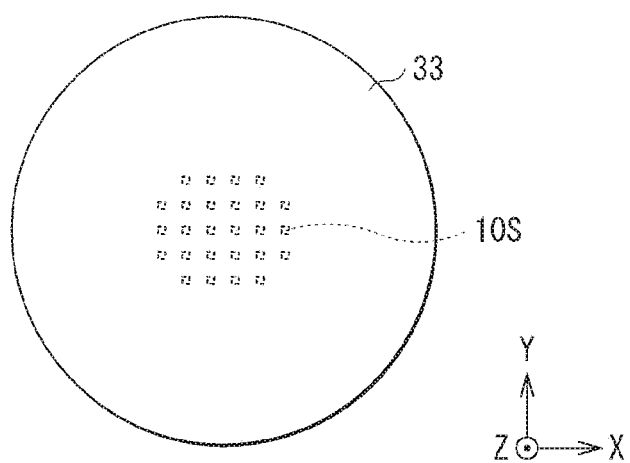
FIG. 9B is a schematic view of an example of a planar configuration of the process illustrated in FIG. 8B.
Figure 10A:
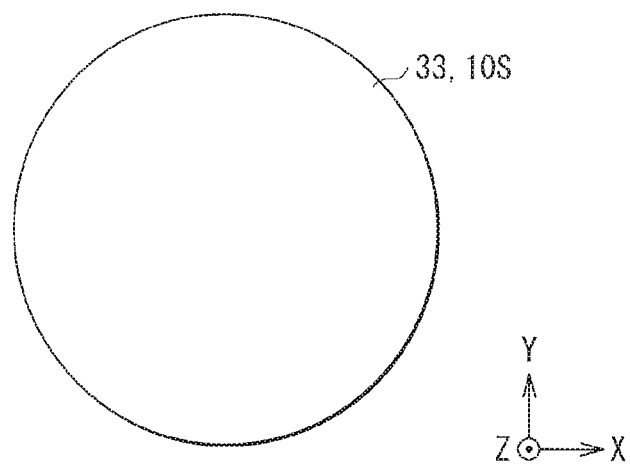
FIG. 10A is a schematic view of another example (1) of a planar configuration of the process illustrated in FIG. 8A.
Figure 10B:
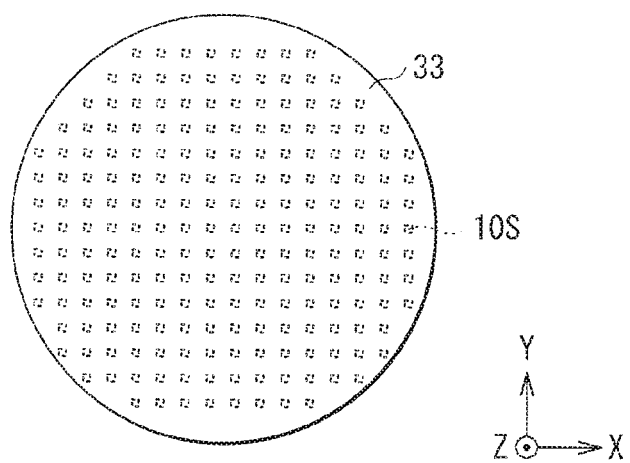
FIG. 10B is a schematic view of another example (1) of a planar configuration of the process illustrated in FIG. 8B.

FIG. 9A illustrates an example of a planar configuration of the semiconductor layer 10S before forming, and FIG. 9B illustrates an example of a planar configuration of the semiconductor layer 10S after forming, which follows FIG. 9A. FIG. 10A illustrates another example of a planar configuration of the semiconductor layer 10S before forming, and FIG. 10B illustrates another example of a planar configuration of the semiconductor layer 10S after forming, which follows FIG. 10A. In these manners, the wafer-shaped semiconductor layer 10S that is smaller than the temporary substrate 33 (FIG. 9A) or has the same size as the temporary substrate 33 (FIG. 10A) is formed into the plurality of chip-shaped semiconductor layers 10S.

Figure 11A:
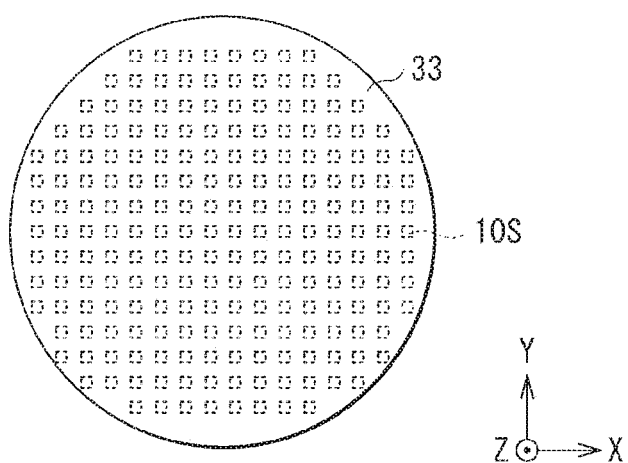
FIG. 11A is a schematic view of another example (2) of a planar configuration of the process illustrated in FIG. 8A.
Figure 11B:
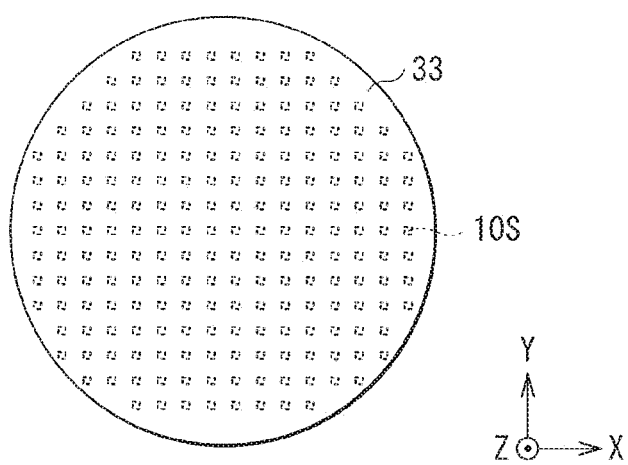
FIG. 11B is a schematic view of another example (2) of a planar configuration of the process illustrated in FIG. 8B.

Alternatively, the plurality of chip-shaped semiconductor layers 10S may be formed into a plurality of smaller chip-shaped semiconductor layers 10S, as illustrated in FIGS. 11A and 11B.

In the etching of the semiconductor layer 10S, the adhesive layer B is etched together with the semiconductor layer 10S, for example. The adhesive layer B may remain wider than the semiconductor layer 10S to spread around the semiconductor layer 10S (FIG. 8B).

Figure 12:
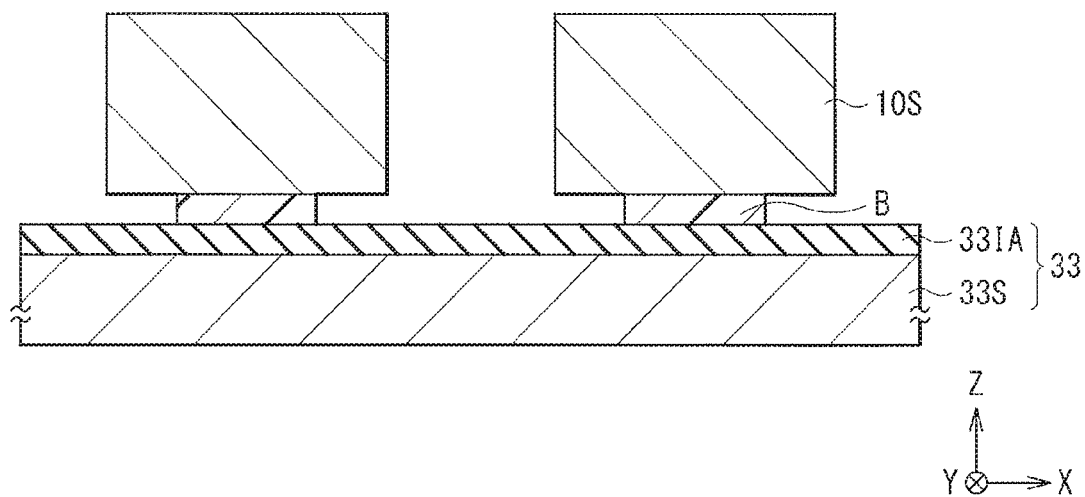
FIG. 12 is a schematic cross-sectional view of another example (1) of the process illustrated in FIG. 8B.

Alternatively, the adhesive layer B may become narrower than the semiconductor layer 10S to cause a gap between the semiconductor layer 10S and the temporary substrate 33, as illustrated in FIG. 12. The adhesive layer B may be etched into the same size as the semiconductor layer 10S.

The adhesive layer B need not be etched in the etching of the semiconductor layer 10S, as illustrated in FIG. 13.

After the forming of the semiconductor layer 10S, the diffusion region 12A is formed for each of the pixels P in the semiconductor layer 10S, as illustrated in FIG. 14A, which results in device separation. For example, the insulating film 17 is used as a hard mask to form the diffusion region 12A. Specifically, the insulating film 17 is formed to cover a top surface (a surface opposite to the junction surface with the temporary substrate 33) and a side surface of the semiconductor layer 10S, and thereafter, an opening is formed by etching in the insulating film 17 covering the top surface of the semiconductor layer 10S. Thereafter, vapor-phase diffusion of a p-type impurity is performed using the insulating film 17 as a hard mask. Thus, the diffusion region 12A is formed in a selective region. The diffusion reaches a depth of, for example, several hundreds of nanometers, and proceeds substantially isotropically. Alternatively, the diffusion region 12A may be formed by ion implantation or the like using a resist mask. In this case, the diffusion region 12A is formed in the semiconductor layer 10S provided on the temporary substrate 33 having a large diameter, which makes it possible to downsize the pixel P.

After the diffusion region 12A is provided in the semiconductor layer 10S, the first electrode 11 is formed on the semiconductor layer 10S, as illustrated in FIG. 14B. For example, the first electrode 11 is formed as follows. A laminated film of titanium (Ti) and tungsten (W) is formed in the opening provided in the insulating film 17 by a chemical vapor deposition (CVD) method, a physical vapor deposition (PVD) method, an atomic layer deposition (ALD) method, an evaporation method, or the like, and thereafter, the laminated film is patterned by photolithography and etching to form the first electrode 11.

After the formation of the first electrode 11, the buried layer 18 is formed on an entire surface of the temporary substrate 33, as illustrated in FIG. 14C. For example, the buried layer 18 is formed as follows. A film of an insulating material is formed on the entire surface of the temporary substrate 33 to bury the semiconductor layer 10S, and thereafter, the insulating material is planarized by chemical mechanical polishing (CMP). Hence, the buried layer 18 is formed to cover a peripheral region (the peripheral region R2) of the semiconductor layer 10S and a top surface (a surface farthest from the temporary substrate 33) of the semiconductor layer 10S. In the present embodiment, the buried layer 18 is formed to fill a level difference between the semiconductor layer 10S and the temporary substrate 33. This suppresses occurrence of a defect in the manufacturing processes resulting from the level difference as described later.

After the formation of the buried layer 18, the wiring layer 10W is formed to face the semiconductor layer 10S with the buried layer 18 in between, as illustrated in FIG. 14D. For example, the interlayer insulating film 19A and the interlayer insulating film 19B are formed in this order on the buried layer 18, and thereafter, an opening is formed in a region, opposed to the first electrode 11, of the interlayer insulating films 19A and 19B. A copper (Cu) film is formed in the opening of the interlayer insulating films 19A and 19B by an evaporation method, a PVD method, a plating method, or the like, and thereafter, a surface of the copper film is polished with use of, for example, a CMP method to form the contact electrode 19E. For example, the dummy electrode 19ED (FIG. 1B) is formed in the peripheral region R2 in the same process as the process of forming the contact electrode 19E. In this case, the wiring layer 10W is formed on the temporary substrate 33 having a large diameter, which makes it possible to use various apparatuses for substrates having a large diameter.

Figure 14E:
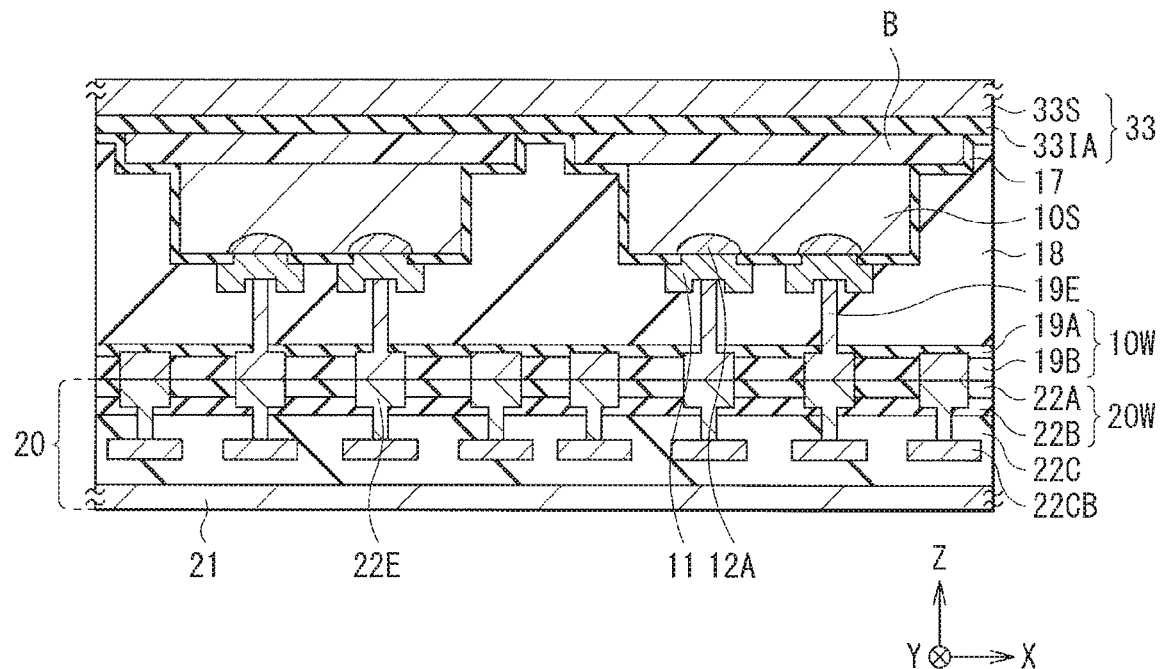
FIG. 14E is a schematic cross-sectional view of a process following the process illustrated in FIG. 14D.

After forming the wiring layer 10W, the readout circuit substrate 20 is bonded to the temporary substrate 33 with the wiring layer 10W in between, as illustrated in FIG. 14E. At this occasion, the wiring layer 20W is formed in the readout circuit substrate 20 in advance. The wiring layer 20W of the readout circuit substrate 20 has the contact electrode 22E and the dummy electrode 22ED, and upon bonding of the readout circuit substrate 20 to the temporary substrate 33, for example, the contact electrode 22E and the dummy electrode 22ED of the wiring layer 20W and the contact electrode 19E and the dummy electrode 19ED of the wiring layer 10W are bonded together by Cu—Cu bonding. More specifically, in the device region R1, the junction surface S2 on which the contact electrode 19E and the contact electrode 22E are bonded together is formed, and in the peripheral region R2, the junction surface S2 on which the dummy electrode 19ED and the dummy electrode 22ED are bonded together is formed. In this case, the peripheral region R2 of the device substrate 10 is also bonded to the readout circuit substrate 20.

Figure 14F:
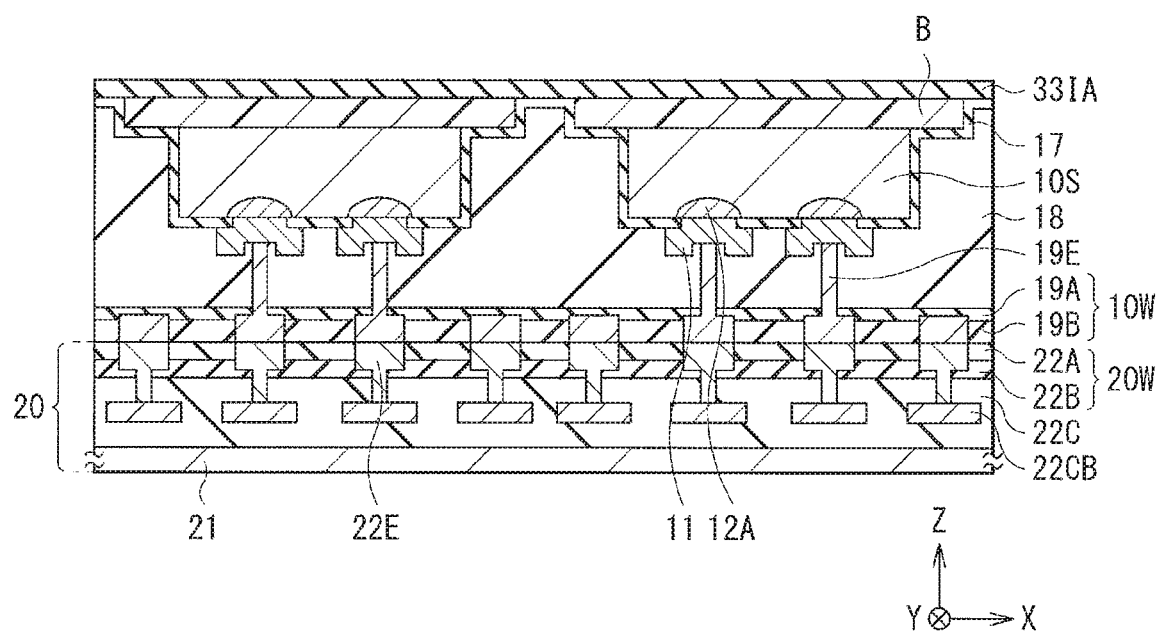
FIG. 14F is a schematic cross-sectional view of a process following the process illustrated in FIG. 14E.

After bonding the readout circuit substrate 20 to the temporary substrate 33, the temporary substrate 33 is removed, as illustrated in FIG. 14F. The temporary substrate 33 may be removed using, for example, mechanical polishing, wet etching, dry etching, or the like.

Figure 14G:
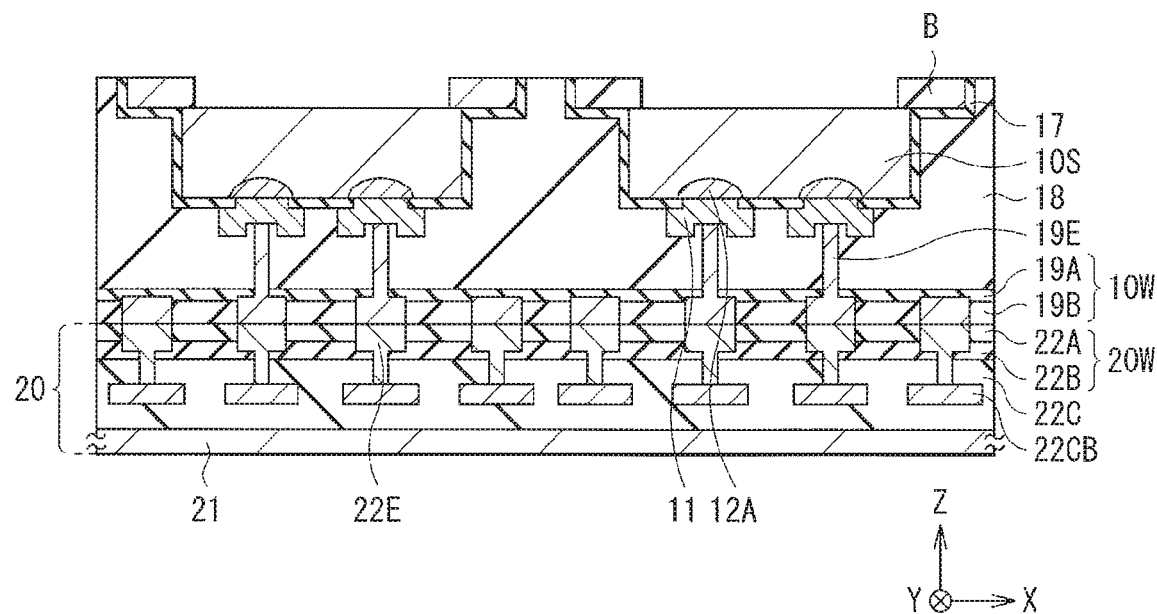
FIG. 14G is a schematic cross-sectional view of a process following the process illustrated in FIG. 14F.

After the removal of the temporary substrate 33, the adhesive layer B and the like are also removed to expose a surface of the semiconductor layer 10S, as illustrated in FIG. 14G. At this occasion, an unnecessary layer of the semiconductor layer 10S may be removed. Moreover, the insulating layer 33IA or the insulating film 17 may partially be caused to remain in a region other than an opening of the semiconductor layer 10S, or the buried layer 18 may be dug halfway.

Figure 14H:
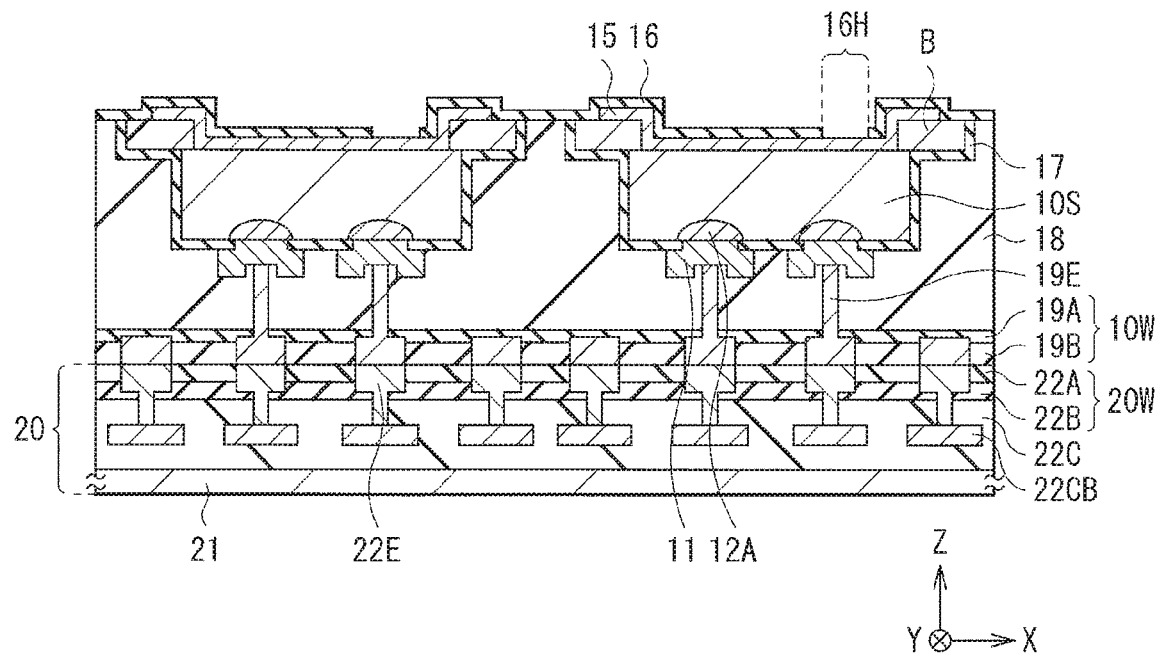
FIG. 14H is a schematic cross-sectional view of a process following the process illustrated in FIG. 14G.
Figure 14I:
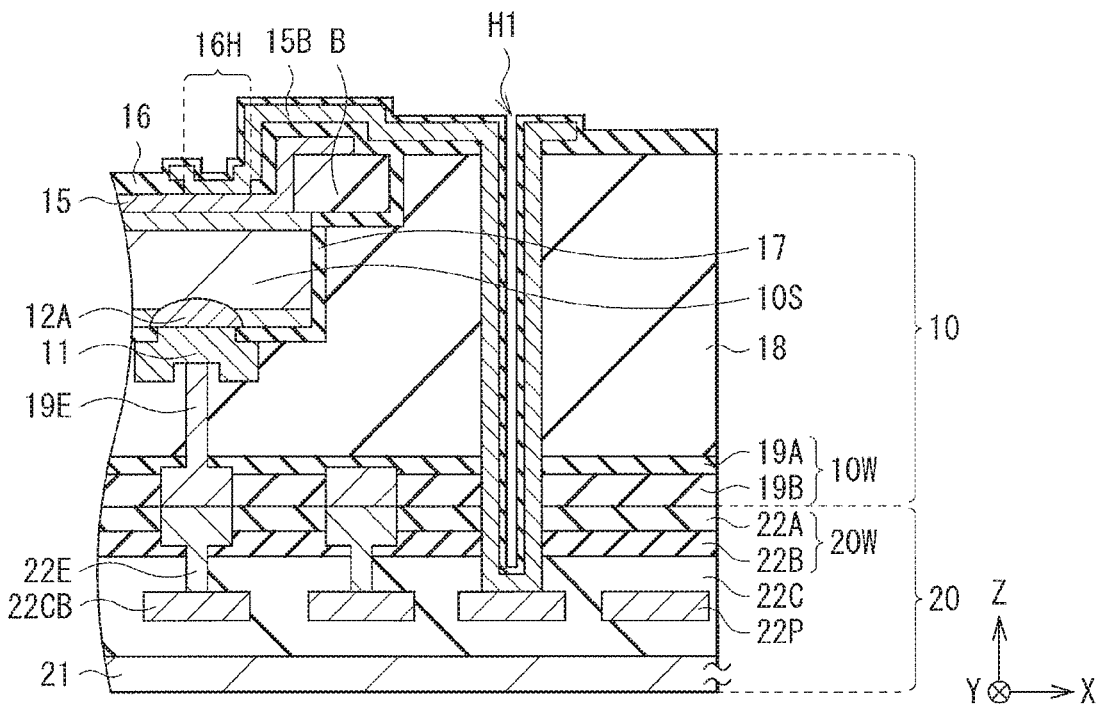
FIG. 14I is a schematic cross-sectional view of a process following the process illustrated in FIG. 14H.

Subsequently, the second electrode 15 and the passivation film 16 are formed in this order on a surface exposed by removing the temporary substrate 33 (a surface opposite to a surface on which the wiring layer 10W is provided) of the semiconductor layer 10S, as illustrated in FIG. 14H. Thereafter, the hole H1 and the electrically-conductive film 15B are formed, as illustrated in FIG. 14I. Thus, the second electrode 15 and the readout circuit substrate 20 are electrically coupled to each other.

Figure 14J:
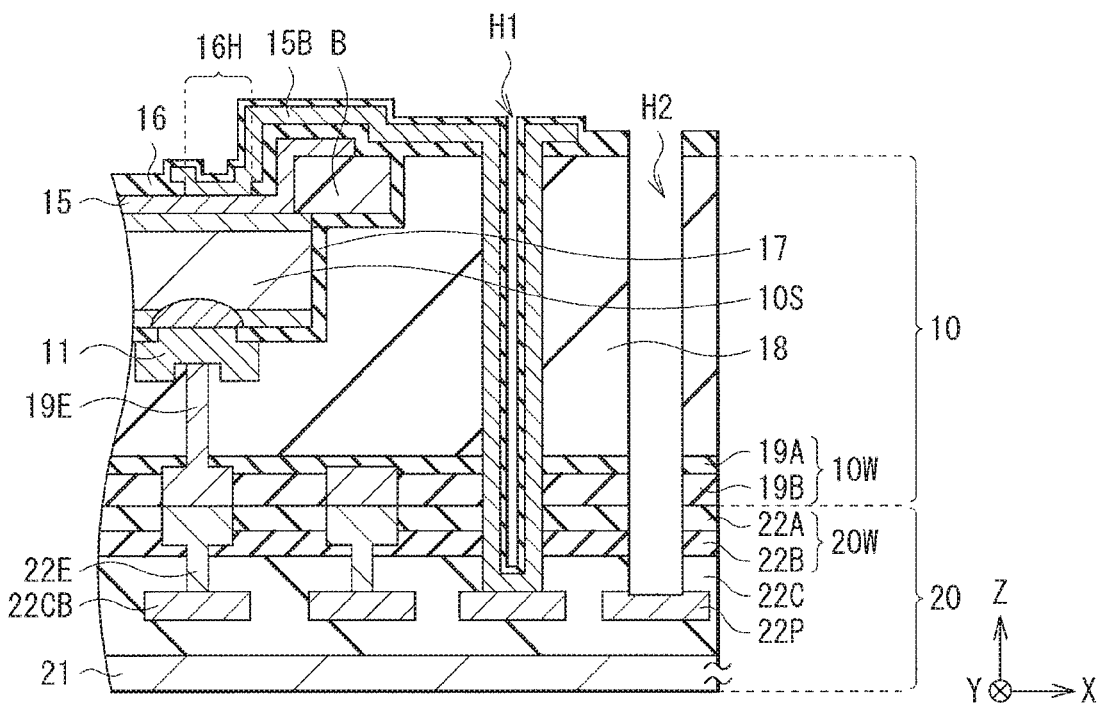
FIG. 14J is a schematic cross-sectional view of a process following the process illustrated in FIG. 14I.

Lastly, the hole H2 is formed as illustrated in FIG. 14J. The hole H2 penetrates through the device substrate 10 to reach the pad electrode 22P of the readout circuit substrate 20. Thus, the light-receiving device 1 illustrated in FIG. 1 is completed.

Operation of Light-receiving Device 1

In the light-receiving device 1, light (e.g., light of a wavelength in the visible region and an infrared region) having entered the photoelectric conversion layer 13 through the passivation film 16, the second electrode 15, and the second contact layer 14 is absorbed by the photoelectric conversion layer 13. The absorption of the light generates pairs of holes and electrons in the photoelectric conversion layer 13 (causes the photoelectric conversion of the light). In this state, a potential gradient is generated in the photoelectric conversion layer 13 upon application of a predetermined voltage to the first electrode 11, for example, causing one of the thus-generated electrical charges (e.g., the holes) to migrate to the diffusion region 12A as the signal charges and to be collected from the diffusion region 12A to the first electrode 11. The thus-collected signal charges migrate to the semiconductor substrate 21 through the contact electrodes 19E and 22E to be read from each of the pixels P.

Workings and Effects of Light-receiving Device 1

The light-receiving device 1 according to the present embodiment includes the buried layer 18 in the peripheral region R2 of the device substrate 10, and the junction surface S2 with the readout circuit substrate 20 is provided also in the peripheral region R2. The buried layer 18 serves to fill the level difference between the semiconductor layer 10S and the temporary substrate 33 in forming the light-receiving device 1. Forming the buried layer 18 makes it possible to suppress occurrence of a defect in the manufacturing processes resulting from the level difference between the semiconductor layer 10S and the temporary substrate 33, which is described below.

The kind of the growth substrate 31 for epitaxial growth of the semiconductor layer 10S is limited. For example, the growth substrate 31 used to grow the photoelectric conversion layer 13 including InGaAs does not have a large diameter. In a case where the growth substrate 31 having a small diameter is used to form the diffusion region 12A for each of the pixels P or to form the wiring layer 10W, it is difficult to downsize the pixels P for reasons such as constraints of apparatuses. Accordingly, a method of manufacturing the light-receiving device using the temporary substrate 33 having a large diameter may be taken into consideration.

However, when the light-receiving device is manufactured without forming the buried layer (the buried layer 18 in FIG. 14C), the wiring layer 10W is formed on the semiconductor layer 10S in a state in which there is a large level difference between the temporary substrate 33 and the semiconductor layer 10S. This may cause defocusing in photolithography in formation of the wiring layer 10W. Moreover, in formation of the contact electrode 19E by CMP on a copper film, copper may remain in a portion corresponding to the level difference. Further, the level difference may cause a bonding failure in bonding of the readout circuit substrate 20 to the temporary substrate 33.

In contrast, in the light-receiving device 1, the buried layer 18 is formed to reduce or eliminate a level difference between the semiconductor layer 10S and the temporary substrate 33, and thereafter, the wiring layer 10W is formed. This makes it possible to suppress occurrence of a defect resulting from the level difference during manufacturing of the foregoing light-receiving device. Accordingly, it is possible to manufacture the light-receiving device 1 using various apparatuses for substrates having a large diameter and to achieve, for example, downsizing of the pixels without being influenced by the size of the growth substrate 31.

Moreover, in the light-receiving device 1, it is possible to from the hole H1 for coupling of the second electrode 15 and the readout circuit substrate 20 in the buried layer 18 in the peripheral region R2. This makes it possible to electrically couple the second electrode 15 and the readout circuit substrate 20 to each other without providing the hole H1 in the semiconductor layer 10S. Further, it is possible to easily form the hole H1 in the buried layer 18 including the insulating material with use of existing techniques.

Furthermore, it is possible to cover the end surface of the semiconductor layer 10S with the buried layer 18 having a sufficient thickness, thereby suppressing entry of water into the semiconductor layer 10S. This makes it possible to suppress deterioration of the semiconductor layer 10S.

As described above, in the light-receiving device 1 according to the present embodiment, the buried layer 18 is formed, which makes it possible to suppress occurrence of a defect in the manufacturing processes resulting from the level difference between the semiconductor layer 10S and the temporary substrate 33. Accordingly, it is possible to manufacture the light-receiving device 1 and to achieve, for example, downsizing of the pixels P without being influenced by the size of the growth substrate 31 used to form the semiconductor layer 10S. In the light-receiving device 1, providing the buried layer 18 forms the junction surface S2 with the readout circuit substrate 20 also in the peripheral region R2 of the device substrate 10.

Moreover, forming the semiconductor layer 10S into a chip shape with a predetermined size on the temporary substrate 33 before forming the buried layer 18 makes it possible to suppress occurrence of misalignment in a later process, thereby easily forming the light-receiving device 1 having a desired structure.

Furthermore, coupling the device substrate 10 and the readout circuit substrate 20 by Cu—Cu bonding between the contact electrodes 19E and 22E makes it possible to downsize the pixels P, which is described below.

There has been proposed a method of coupling a device substrate including a compound semiconductor and a readout circuit substrate including a readout circuit by using a solder bump, an indium bead, or the like. In a case of using these coupling means, a diameter of a bump or a bead formed in an assembly process of a semiconductor device and a length of one side of an electrode pad to be put into contact with the bump or the bead are, for example, several tens of micrometers or 100 µm or more. In contrast, in using Cu—Cu bonding, a length of one side of a Cu pad formed in a wafer process of a semiconductor device is several micrometers. Therefore, in the light-receiving device 1, the contact electrodes 19E and 22E provided for each of the pixels P each have a size reduced to about one-tenth of a size of a solder bump or the like. This enables the pixel P to be reduced in size.

In the following, description is given of modification examples of the foregoing embodiment and other embodiments. Note that the same components in the following description as those of the embodiment described above are denoted with the same reference numerals, and any redundant description thereof is omitted.

First Modification Example

Figure 15:
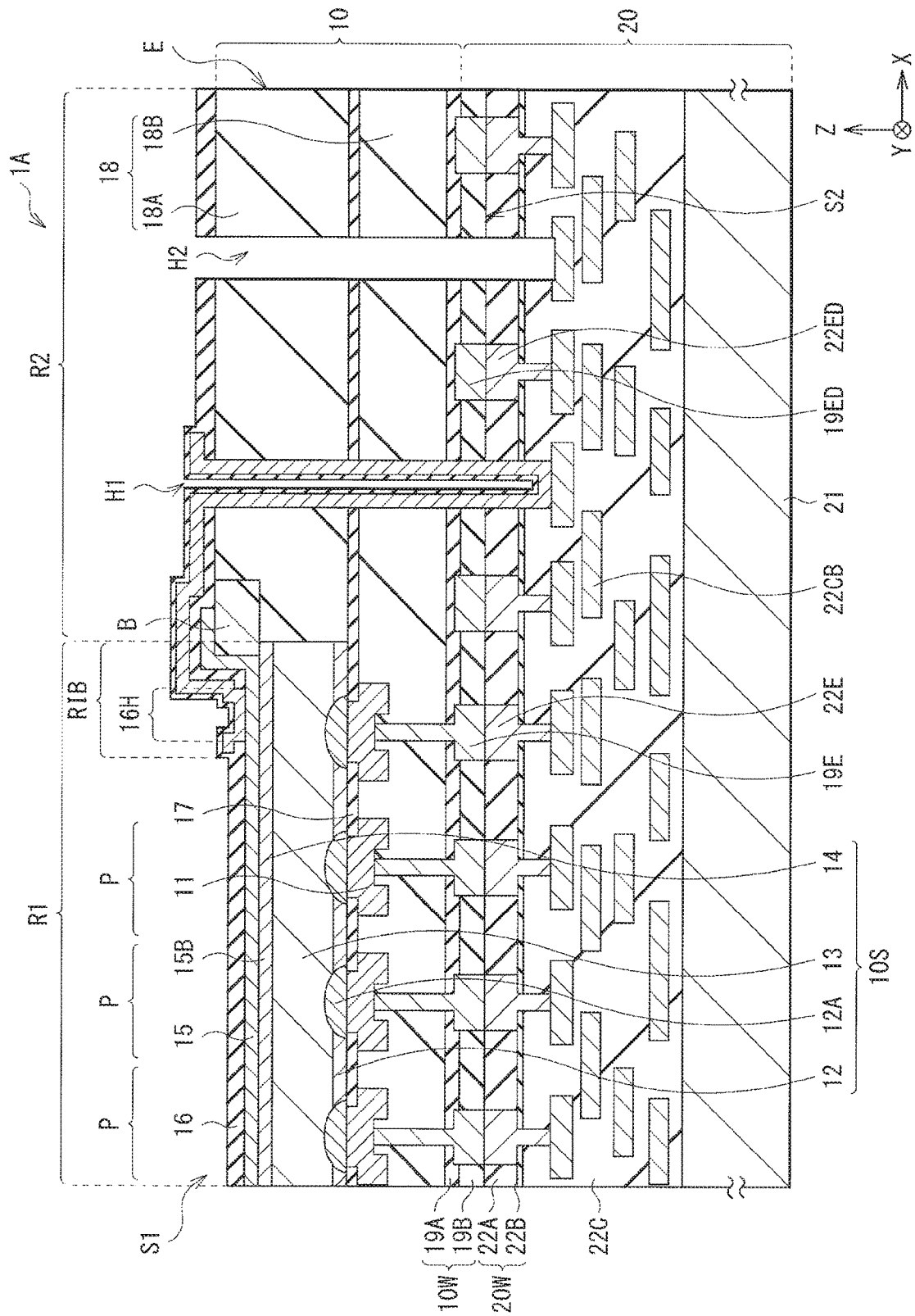
FIG. 15 is a schematic cross-sectional view of a schematic configuration of a light-receiving device according to a first modification example.

FIG. 15 illustrates a cross-sectional configuration of a main part of a light-receiving device (a light-receiving device 1A) according to a first modification example of the foregoing first embodiment. The light-receiving device 1A has a configuration and effects that are similar to those of the light-receiving device 1, with an exception that the buried layer 18 in the light-receiving device 1A includes a first buried layer 18A and a second buried layer 18B that are stacked.

The first buried layer 18A is disposed in the peripheral region R2, and is provided closer to the light incident surface S1 than the second buried layer 18B is. Specifically, the first buried layer 18A is disposed between the second buried layer 18B and the passivation film 16, and covers an end surface of the semiconductor layer 10S.

The second buried layer 18B is provided over the device region R1 and the peripheral region R2. The second buried layer 18B in the device region R1 is disposed between the wiring layer 10W and the semiconductor layer 10S, and covers a bottom surface (a surface facing the readout circuit substrate 20) of the semiconductor layer 10S as well as a bottom surface and a side surface of the first electrode 11. The second buried layer 18B in the peripheral region R2 is disposed between the wiring layer 10W and the first buried layer 18A. The first buried layer 18A and the second buried layer 18B may include the same material or different materials. The first buried layer 18A and the second buried layer 18B may have the same thickness or different thicknesses.

The insulating film 17 is provided on substantially the same plane over the device region R1 and the peripheral region R2. The insulating film 17 is disposed between the semiconductor layer 10S and the second buried layer 18B in the device region R1, and is disposed between the first buried layer 18A and the second buried layer 18B in the peripheral region R2.

Such a light-receiving device 1A is able to be manufactured in the following manner, for example. FIGS. 16A to 19B illustrate manufacturing processes of the light-receiving device 1A in order of processes.

First, the semiconductor layer 10S on the temporary substrate 33 is formed into a plurality of chip shapes, in a manner similar to a manner described in the first embodiment (FIG. 8B).

Figure 16A:
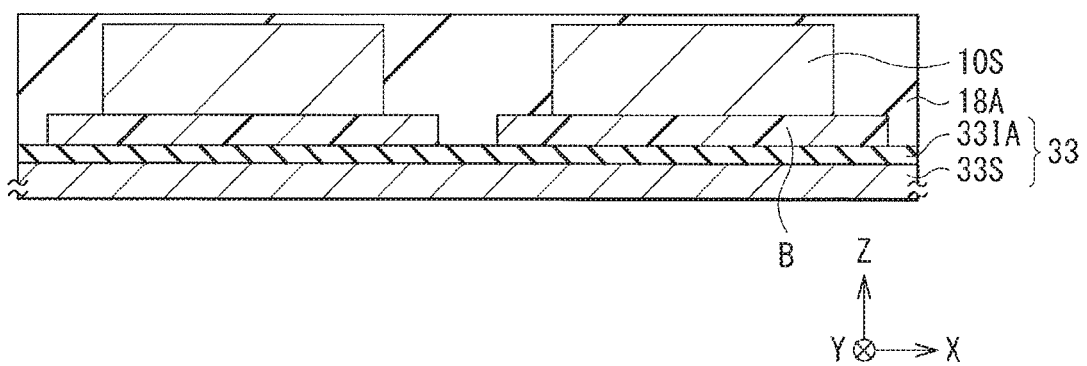
FIG. 16A is a schematic cross-sectional view that describes a process of a method of manufacturing the light-receiving device illustrated in FIG. 15.

Then, the first buried layer 18A is formed on an entire surface of the temporary substrate 33, as illustrated in FIG. 16A. For example, the first buried layer 18A is formed as follows. A film of an insulating material is formed on the entire surface of the temporary substrate 33 to bury the semiconductor layer 10S, and thereafter, the insulating material is planarized by CMP. Thus, the first buried layer 18A is formed to cover a region around the semiconductor layer 10S. At this occasion, a top surface of the semiconductor layer 10S may be exposed from the first buried layer 18A.

Figure 16B:
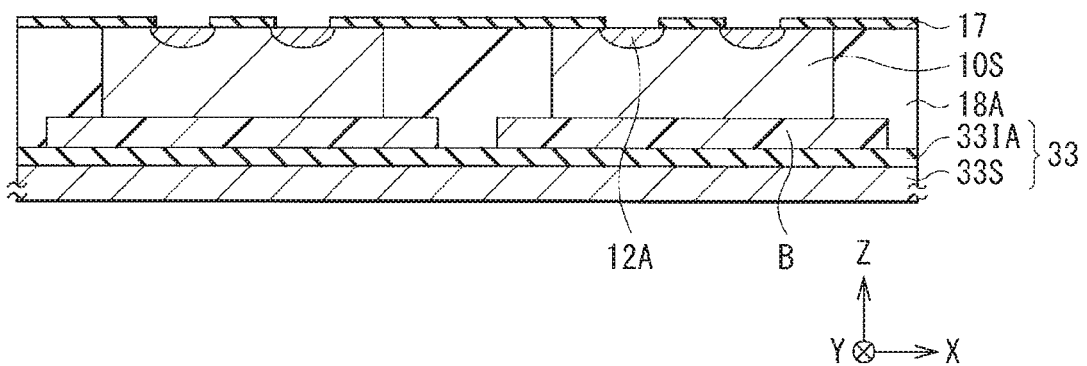
FIG. 16B is a schematic cross-sectional view of a process following the process illustrated in FIG. 16A.

After the formation of the first buried layer 18A, the diffusion region 12A is formed in the semiconductor layer 10S by using a mask formed using the insulating film 17, for example, as illustrated in FIG. 16B. The insulating film 17 is formed on the first buried layer 18A.

Figure 17:
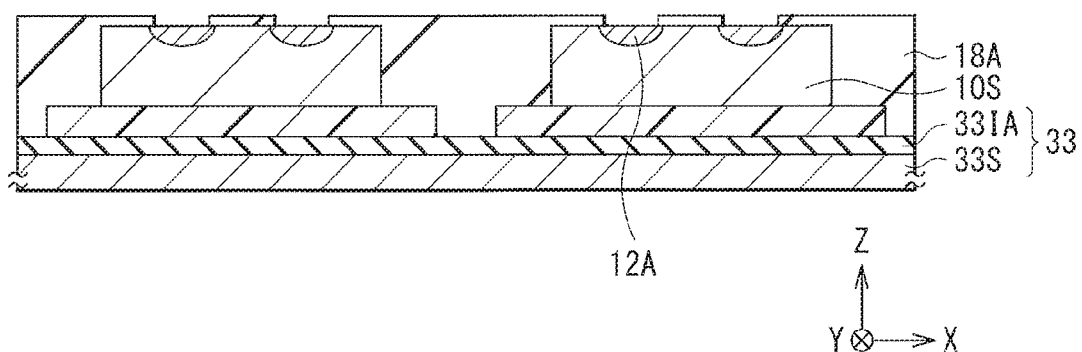
FIG. 17 is a schematic cross-sectional view of another example (1) of the process illustrated in FIG. 16B.
Figure 18:
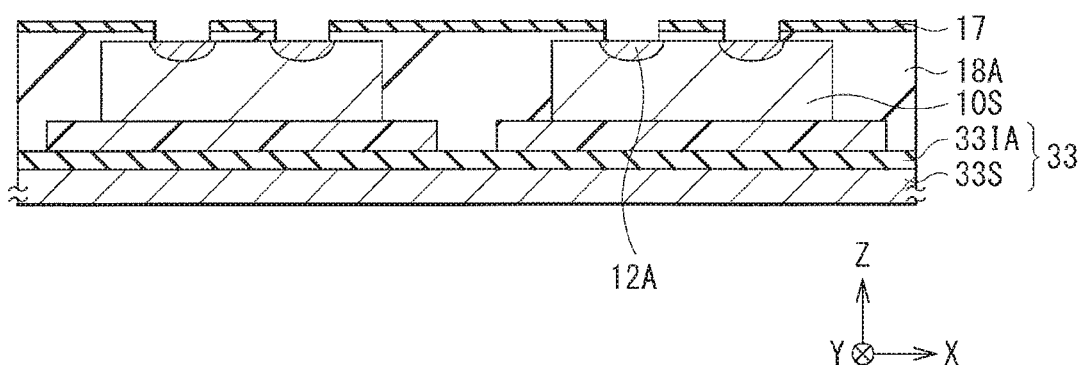
FIG. 18 is a schematic cross-sectional view of another example of the process illustrated in FIG. 16B.

The mask for forming the diffusion region 12A may be formed using the first buried layer 18A as illustrated in FIG. 17, or may be formed using the first buried layer 18A and the insulating film 17 as illustrated in FIG. 18.

Figure 19A:
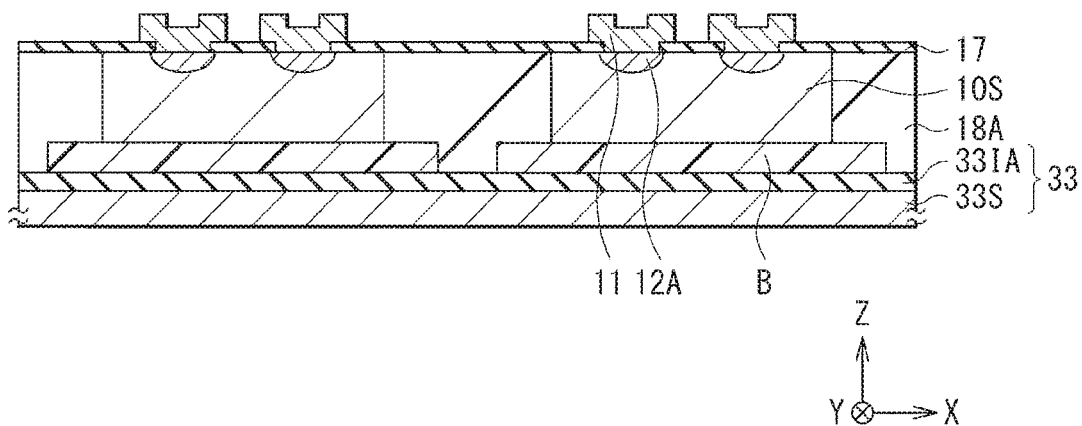
FIG. 19A is a schematic cross-sectional view of a process following the process illustrated in FIG. 16B.

After the diffusion region 12A is formed in the semiconductor layer 10S, the first electrode 11 is formed in an opening of the insulating film 17, as illustrated in FIG. 19A.

Figure 19B:
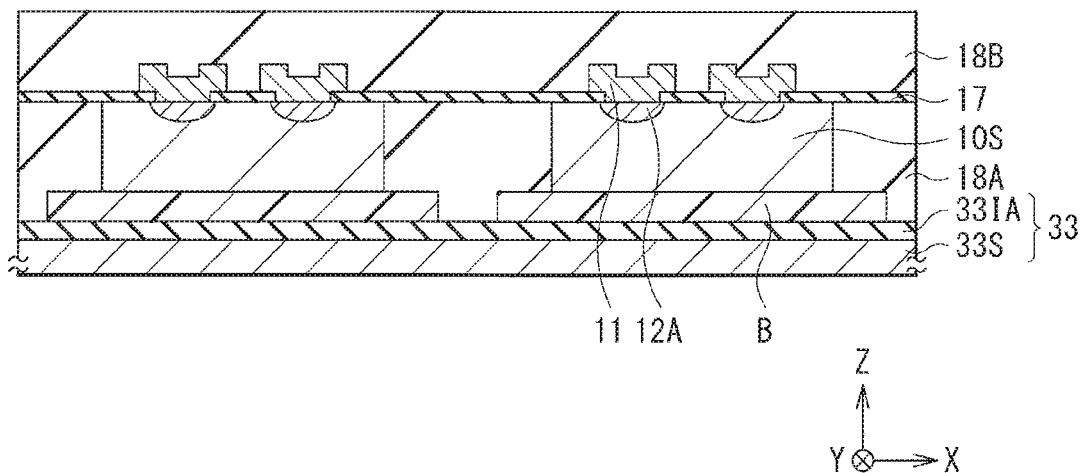
FIG. 19B is a schematic cross-sectional view of a process following the process illustrated in FIG. 19A.

After the formation of the first electrode 11, the second buried layer 18B is formed on the first buried layer 18A to cover the first electrode 11, as illustrated in FIG. 19B. The second buried layer 18B is formed as follows. A film of an insulating material is formed on the entire surface of the temporary substrate 33, and thereafter, the insulating material is planarized by CMP. Subsequent processes are performed in a manner similar to a manner described in the first embodiment (FIGS. 14D to 14J) to complete the light-receiving device 1A.

The buried layer 18 may include a stacked structure of the first buried layer 18A and the second buried layer 18B, as with the present modification example. Even in this case, it is possible to achieve effects similar to those in the foregoing first embodiment.

Second Modification Example

Figure 20:
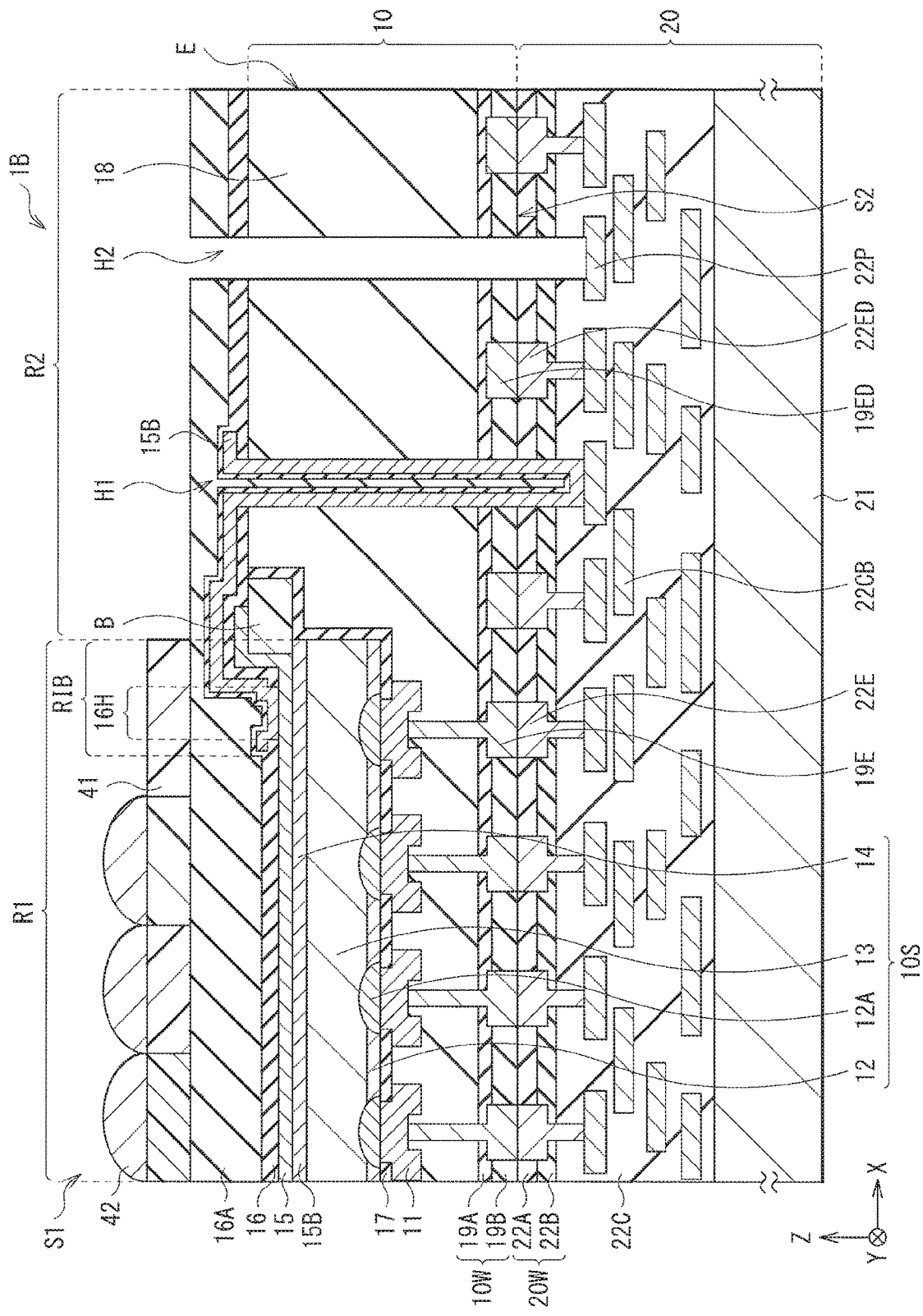
FIG. 20 is a schematic cross-sectional view of a schematic configuration of a light-receiving device according to a second modification example.

FIG. 20 illustrates a cross-sectional configuration of a main part of a light-receiving device (a light-receiving device 1B) according to a second modification example of the foregoing first embodiment. The light-receiving device 1B has a configuration and effects that are similar to those of the light-receiving device 1, with an exception that the light-receiving device 1B includes a color filter layer 41 and an on-chip lens (converging lens) 42 on the light incident surface S1 (a surface opposite to a surface facing the readout circuit substrate 20) of the device substrate 10.

In the light-receiving device 1B, for example, the color filter layer 41 and the on-chip lens 42 are provided in this order on the passivation film 16 of the device substrate 10, with a planarization film 16A in between. The color filter layer 41 may include an infrared (IR) filter. Providing the color filter layer 41 makes it possible to obtain light reception data of a wavelength corresponding to each of the pixels P.

The on-chip lens 42 serves to allow light having entered the light-receiving device 1 to be collected toward the photoelectric conversion layer 13. The on-chip lens 42 includes, for example, an organic material, a silicon oxide ($SiO_2$), or the like. In the light-receiving device 1B, the buried layer 18 is provided in the peripheral region R2, which makes it possible to reduce or eliminate a level difference between the device region R1 and the peripheral region R2 of the device substrate 10, thereby forming the planarized light incident surface S1. This makes it possible to form the on-chip lens 42 with high accuracy with use of, for example, a photolithography process. For example, the color filter layer 41 and the on-chip lens 42 are terminated in the device region R1. The planarization film 16A disposed between the passivation film 16 and the color filter layer 41 is, for example, provided from the device region R1 to the peripheral region R2, and is terminated in the peripheral region R2. The color filter layer 41, the on-chip lens 42, and the planarization film 16A each may be terminated at any position in the device region R1 or in the peripheral region R2.

The color filter layer 41 and the on-chip lens 42 may be provided on the light incident surface S1 of the device substrate 10, as with the present modification example. Even in this case, it is possible to achieve effects similar to those in the foregoing first embodiment. Moreover, it is possible to easily form the on-chip lens 42, with high accuracy, on the light incident surface S1 planarized by the buried layer 18, Second Embodiment FIGS. 21A to 21E illustrate manufacturing processes of a light-receiving device (a light-receiving device 2 illustrated in FIG. 22) according to a second embodiment in order of processes. The light-receiving device 2 has a configuration, workings, and effects that are similar to those of the light-receiving device 1, with an exception that the light-receiving device 2 is manufactured by forming a cap layer used to protect the semiconductor layer 10S (a cap layer 35 illustrated in FIG. 21A), and thereafter bonding the semiconductor layer 10S to the temporary substrate 33 with the cap layer in between.

The light-receiving device 2 may be manufactured using the cap layer 35 in the following manner, for example.

Figure 21A:
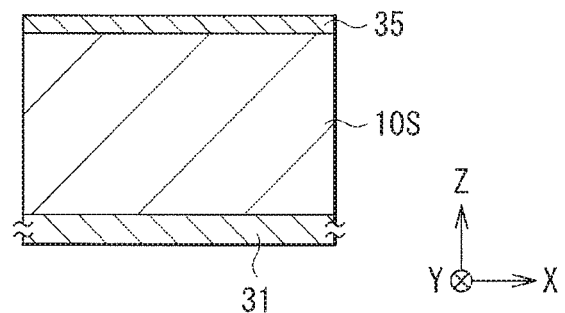
FIG. 21A is a schematic cross-sectional view that describes a process of a method of manufacturing a light-receiving device according to a second embodiment of the present disclosure.

First, for example, the semiconductor layer 10S and the cap layer 35 including i-type InGaAs are formed on the growth substrate 31 in this order by epitaxial growth, as illustrated in FIG. 21A. As the semiconductor layer 10S, for example, the first contact layer 12 including n-type InP, the photoelectric conversion layer 13 including i-type or n-type InGaAs, and the second contact layer 14 including n-type InP are formed in this order.

The cap layer 35 serves to prevent the semiconductor layer 10S from being in direct contact with the adhesive layer B used to bond the semiconductor layer IOS to the temporary substrate 33. In a case where processes proceed while the adhesive layer B is in contact with the semiconductor layer 10S, characteristics of the semiconductor layer 10S may be deteriorated. Alternatively, the semiconductor layer 10S may be peeled from the temporary substrate 33, or the semiconductor layer IOS may be peeled from the adhesive layer B. Providing the cap layer 35 between the semiconductor layer 10S and the adhesive layer B makes it possible to suppress occurrence of such deterioration in characteristics, such film peeling, and the like. The cap layer 35 may include any semiconductor material that is allowed to be epitaxially grown on the semiconductor layer 10S (more specifically on the second contact layer 14). For example, InGaAs, InAsSb, or the like may be used for the cap layer 35.

After the cap layer 35 is formed on the semiconductor layer 10S, the adhesive layer B including, for example, silicon oxide ($SiO_2$) is formed on the cap layer 35.

Figure 21B:
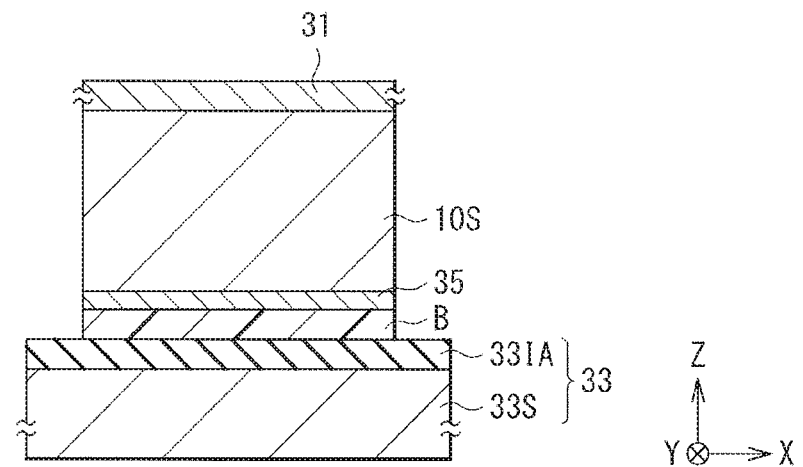
FIG. 21B is a schematic cross-sectional view of a process following the process illustrated in FIG. 21A.

Subsequently, the growth substrate 31 is bonded to the temporary substrate 33 having a large diameter with the adhesive layer B in between, as illustrated in FIG. 21B. At this occasion, the cap layer 35 is interposed between the adhesive layer B and the second contact layer 14. The adhesive layer B may include, for example, tetraethoxysilane (TEOS), silicon oxide ($SiO_2$), or the like.

Figure 21C:
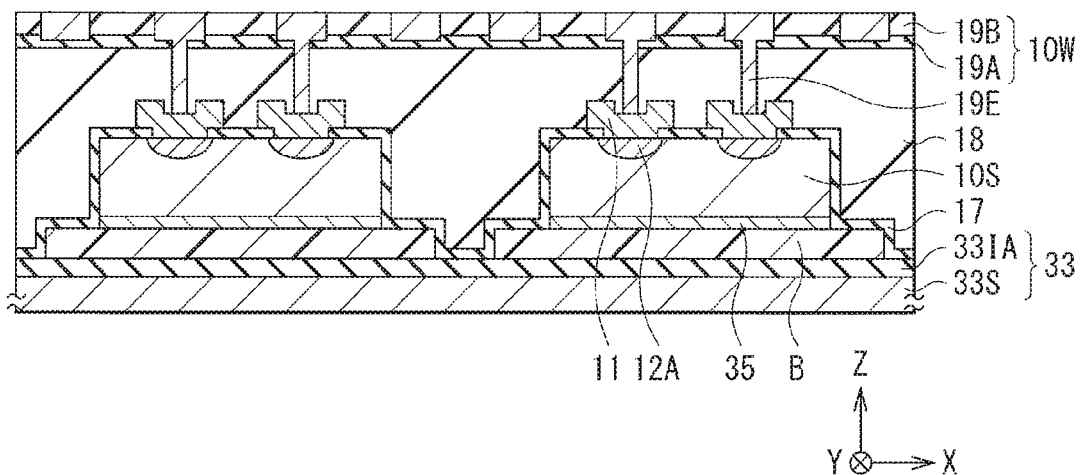
FIG. 21C is a schematic cross-sectional view of a process following the process illustrated in FIG. 21B.

Subsequently, removal of the growth substrate 31, forming of the semiconductor layer 10S, formation of the diffusion region 12A by impurity diffusion, formation of the first electrode 11, and formation of the buried layer 18 are performed in this order in a manner similar to the manner described in the foregoing first embodiment (refer to FIGS. 8A to 14C), Thereafter, the wiring layer 10W is formed on the buried layer 18, as illustrated in FIG. 21C. In the present embodiment, as with the light-receiving device 1, the buried layer 18 that fills the level difference between the semiconductor layer 10S and the temporary substrate 33 is formed, which makes it possible to suppress occurrence of a defect in the manufacturing processes resulting from the level difference. Moreover, in processes including removal of the growth substrate 31, formation of the diffusion region 12A, formation of the wiring layer 10W, and the like, the cap layer 35 is interposed between the adhesive layer B and the second contact layer 14, which makes it possible to suppress occurrence of deterioration in characteristics of the semiconductor layer 10S, film peeling, and the like.

Figure 21D:
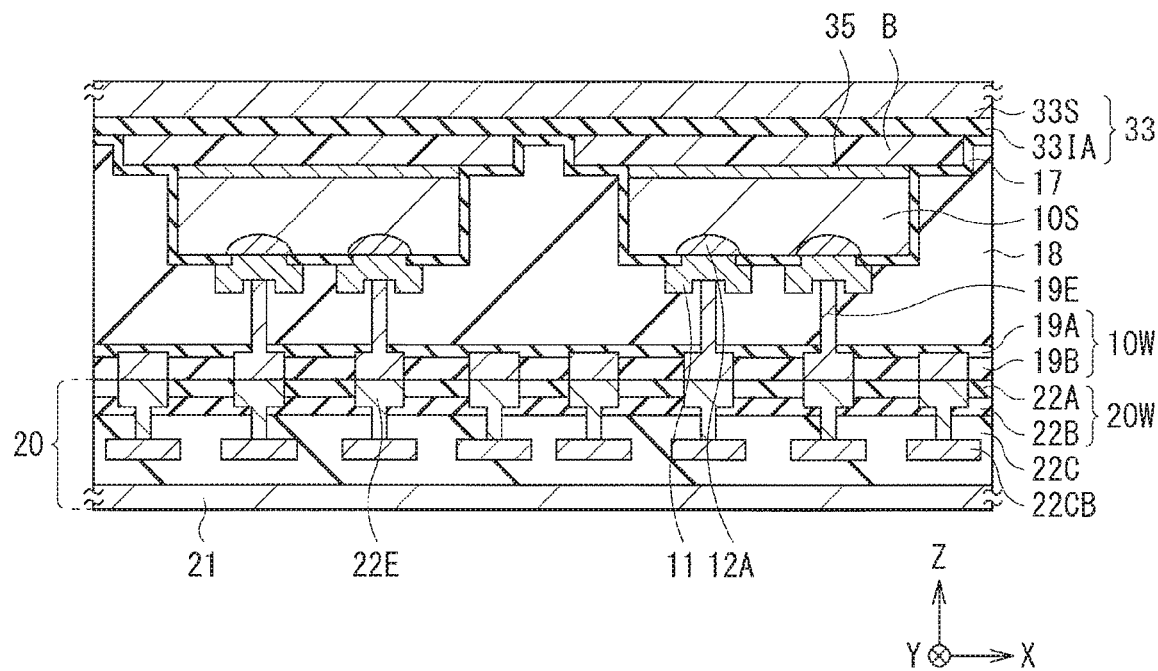
FIG. 21D is a schematic cross-sectional view of a process following the process illustrated in FIG. 21C.

After forming the wiring layer 10W, the temporary substrate 33 is bonded to the readout circuit substrate 20 with the wiring layer 10W in between in a manner similar to the manner described in the foregoing first embodiment (FIG. 21D).

Figure 21E:
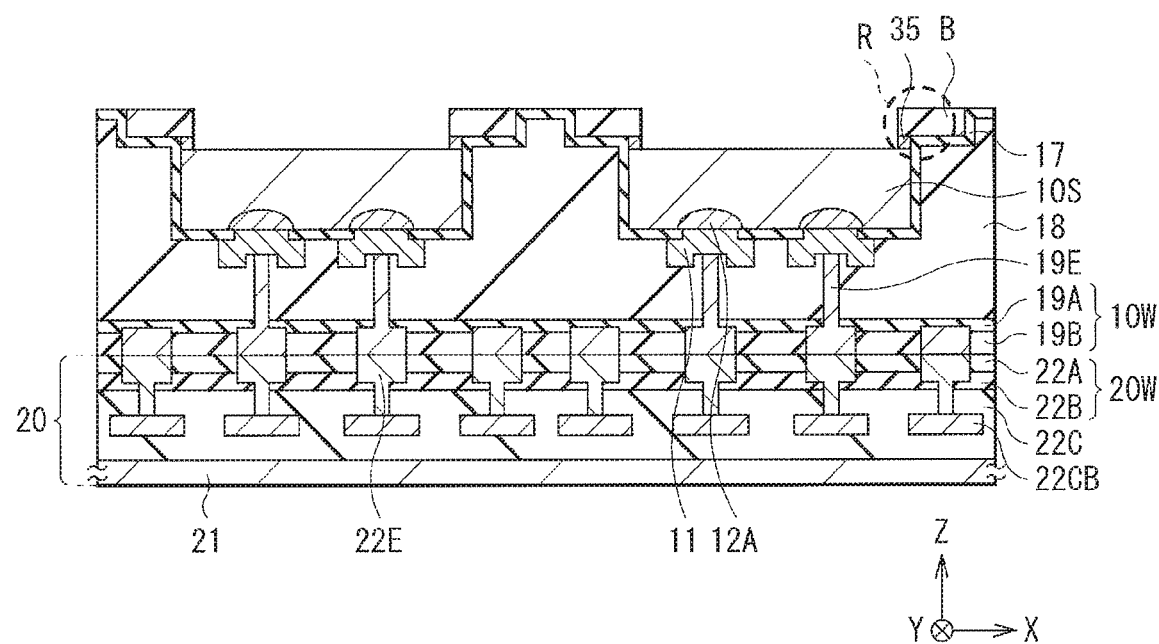
FIG. 21E is a schematic cross-sectional view of a process following the process illustrated in FIG. 21D.

Subsequently, the temporary substrate 33, the adhesive layer B, and the cap layer 35 are removed in this order to expose the second contact layer 14, as illustrated in FIG. 21E. Removal of the temporary substrate 33 is performed in a manner similar to the manner described in the foregoing first embodiment. The adhesive layer B and the cap layer 35 may be removed by, for example, wet etching. For wet etching on the adhesive layer B, for example, hydrogen fluoride (HF), buffered hydrogen fluoride (BHF), or the like may be used. For wet etching on the cap layer 35, for example, a mixed liquid of an acid and an oxidizer may be used. Examples of the acid to be used for the wet etching may include HF, hydrochloric acid (HCl), a phosphoric acid ($H_3PO_4$), and the like. Examples of the oxidizer to be used for the wet etching may include hydrogen peroxide water, ozone water, and the like. The adhesive layer B and the cap layer 35 may be removed by dry etching; however, the wet etching is preferably used to remove the adhesive layer B and the cap layer 35 (as described later).

Figure 23A:
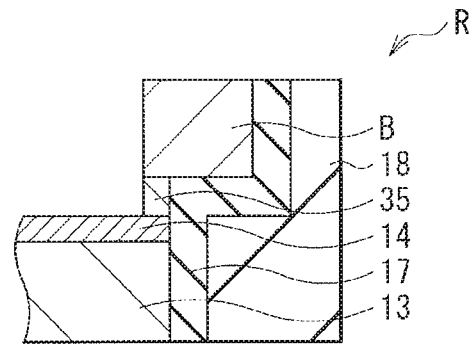
FIG. 23A is a schematic enlarged cross-sectional view (1) of a portion illustrated in FIG. 21E.

FIG. 23A is an example of an enlarged view of a portion R illustrated in FIG. 21E. For example, a region where the adhesive layer B and the cap layer 35 are to be removed is smaller in area than the semiconductor layer 10S in a plan view. Accordingly, the cap layer 35 and the adhesive layer B remain in an outer edge on side on which the light incident surface S1 is located (the surface opposite to the surface facing the readout circuit substrate 20) of the semiconductor layer 10S, more specifically on an end portion of the second contact layer 14. It is to be noted that the cap layer 35 may be recessed or protrude with respect to the adhesive layer B.

Processes after the removal of the cap layer 35 are performed in a manner similar to a manner described in the first embodiment (FIGS. 14H to 14J) to complete the light-receiving device 2.

Figure 22:
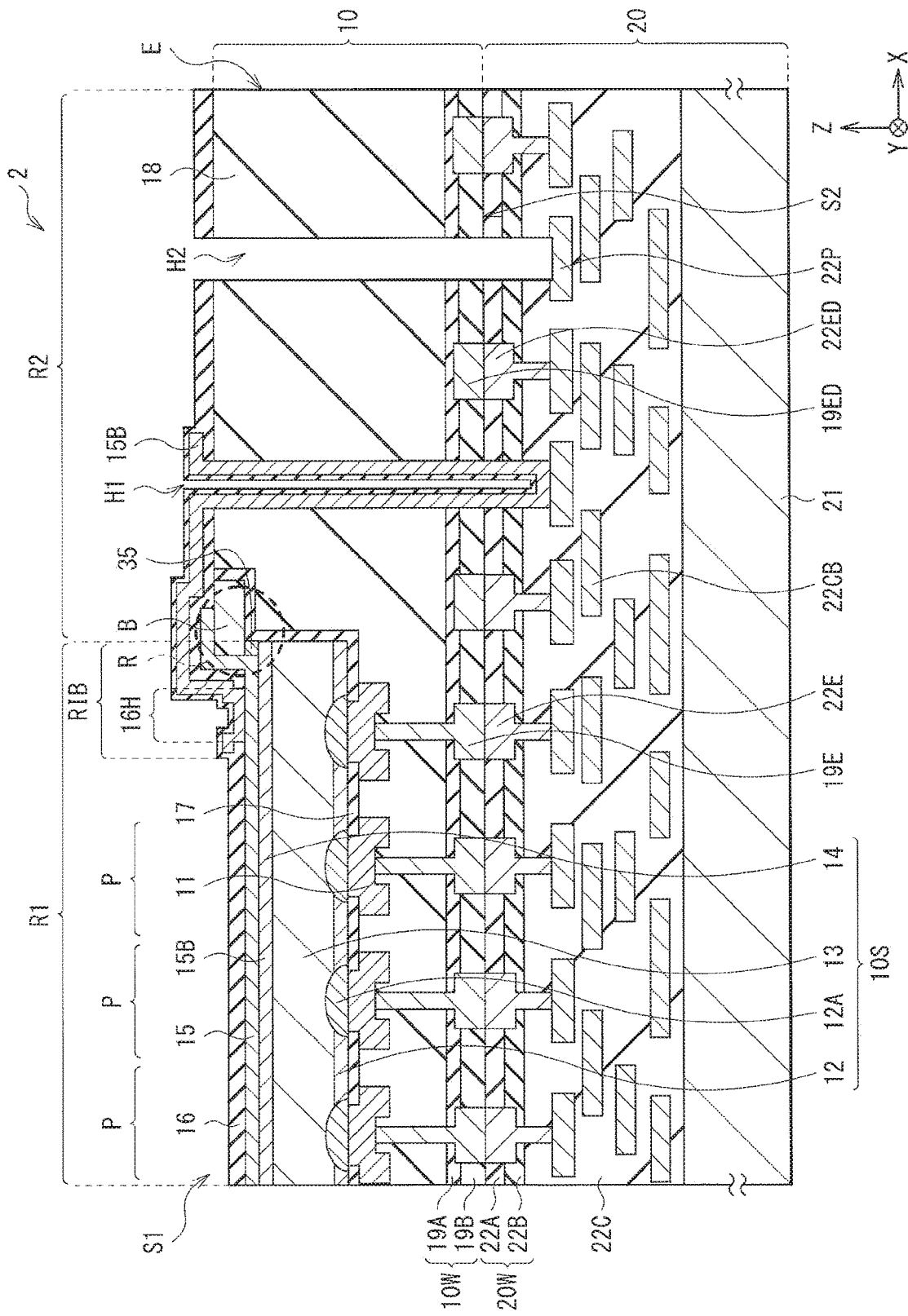
FIG. 22 is a schematic cross-sectional view of a configuration of a main part of a light-receiving device that is completed through a process following the process illustrated in FIG. 21E.

FIG. 22 illustrates an example of a cross-sectional configuration of a main part of the light-receiving device 2 manufactured in this manner.

Figure 23B:
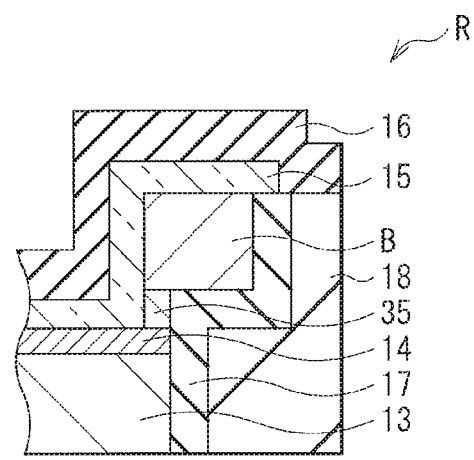
FIG. 23B is a schematic enlarged cross-sectional view (1) of a portion illustrated in FIG. 22.

FIG. 23B is an example of an enlarged view of the portion R illustrated in FIG. 22. The second electrode 15 and the passivation film 16 may be formed in a state in which the cap layer 35 and the adhesive layer 13 remain, as illustrated in the drawing. At this occasion, the second electrode 15 is in contact with the second contact layer 14 and in contact with the cap layer 35 and the adhesive layer B. The buried layer 18 protrudes by an amount corresponding to thicknesses of the cap layer 35 and the adhesive layer 13 from the semiconductor layer 10S toward the light incident surface S1 (toward side opposite to the readout circuit substrate 20).

Figure 23C:
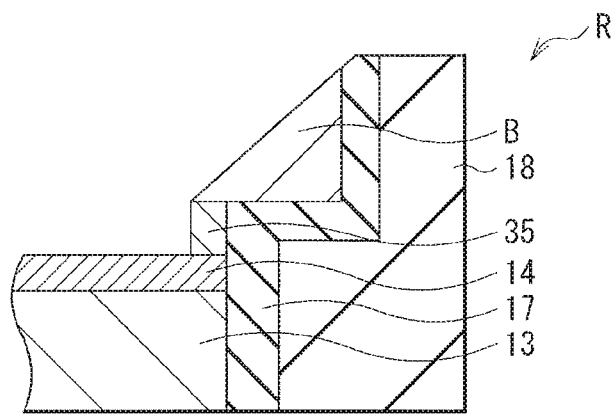
FIG. 23C is a schematic cross-sectional view of another example of a shape of an opening illustrated in FIG. 23A.

An opening formed by removing the adhesive layer B and the cap layer 35, i.e., an opening to which the second contact layer 14 is exposed preferably has a tapered shape as illustrated in FIG. 23C. The second electrode 15 is formed in the opening having such a tapered shape, which improves coverage of the second electrode 15. For example, the adhesive layer B and the cap layer 35 are removed by wet etching to form the opening having a tapered shape. Hence, the adhesive layer B and the cap layer 35 are preferably removed by the wet etching.

Figure 24A:
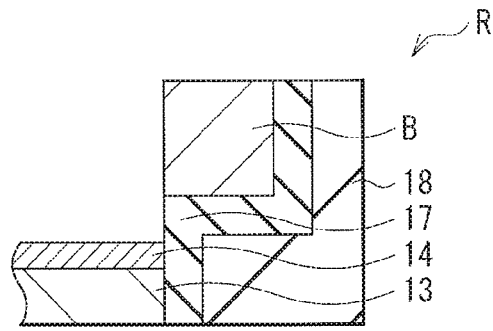
FIG. 24A is a schematic enlarged cross-sectional view (2) of a portion illustrated in FIG. 21E.
Figure 24B:
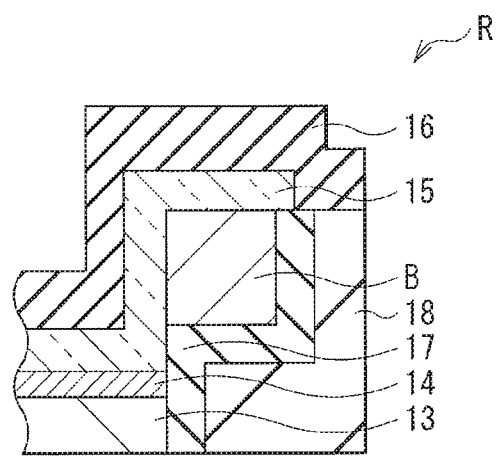
FIG. 24B is a schematic enlarged cross-sectional view (2) of a portion illustrated in FIG. 22.

FIG. 24A is another example of an enlarged view of the portion R illustrated in FIG. 21E, and FIG. 24B is another example of an enlarged view of the portion R illustrated in FIG. 22. For example, an area of the region where the adhesive layer B and the cap layer 35 are to be removed may be equal to the area of the semiconductor layer 10S in a plan view as illustrated in the drawings. Hence, the cap layer 35 on the end portion of the second contact layer 14 is removed. In the thus-formed light-receiving device 2, displacement between a top surface (a surface on side on which the light incident surface S1 is located) of the second contact layer 14 and a bottom surface (a surface on side on which the readout circuit substrate 20 is located) of the adhesive layer B forms a level difference therebetween caused by the cap layer 35. Moreover, the second electrode 15 is in contact with the second contact layer 14 and in contact with the adhesive layer B.

Figure 24C:
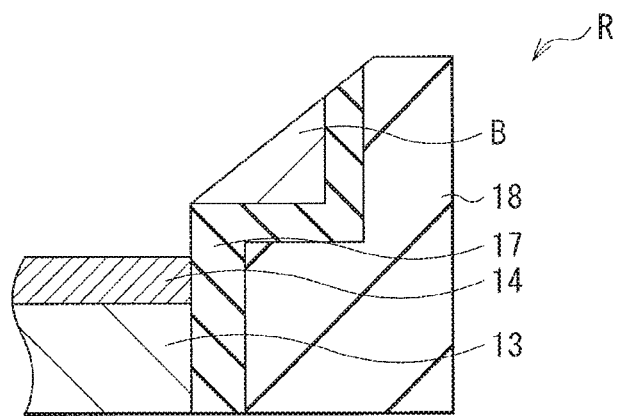
FIG. 24C is a schematic cross-sectional view of another example of a shape of an opening illustrated in FIG. 24A.

The opening formed by removing the adhesive layer B and the cap layer 35, i.e., the opening to which the second contact layer 14 is exposed preferably has a tapered shape as illustrated in FIG. 24C.

Figure 25A:
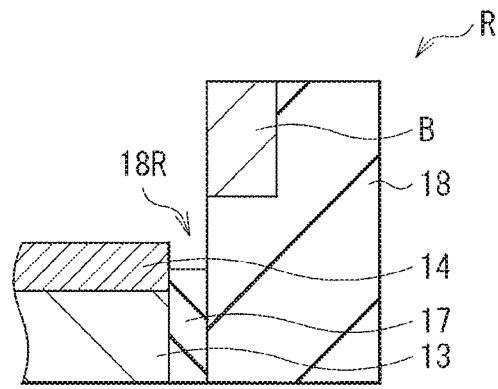
FIG. 25A is a schematic enlarged cross-sectional view (3) of a portion illustrated in FIG. 21E.
Figure 25B:
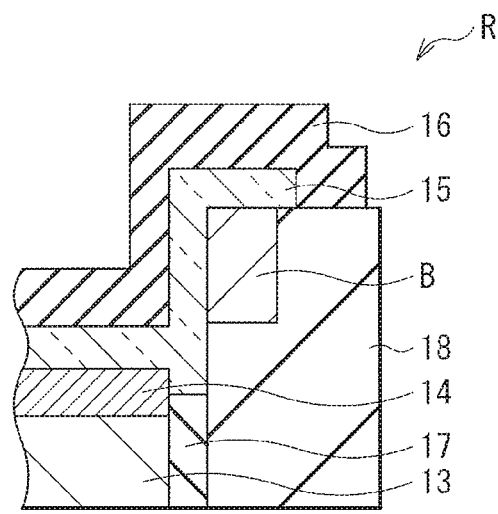
FIG. 25B is a schematic enlarged cross-sectional view (3) of a portion illustrated in FIG. 22.

FIG. 25A is another example of an enlarged view of the portion R illustrated in FIG. 21E, and FIG. 25B is another example of an enlarged view of the portion R illustrated in FIG. 22. For example, the area of the region where the adhesive layer B and the cap layer 35 are to be removed may be larger than the area of the semiconductor layer 10S in a plan view, as illustrated in the drawings. Hence, the cap layer 35 on the end portion of the second contact layer 14 is removed. In the thus-formed light-receiving device 2, a recess 18R resulting from etching is formed between an end surface of the semiconductor layer 10S and the buried layer 18. Moreover, the second electrode 15 is in contact with the second contact layer 14 and is buried in the recess 18R, and the second electrode 15 is also in contact with the adhesive layer B.

Figure 25C:
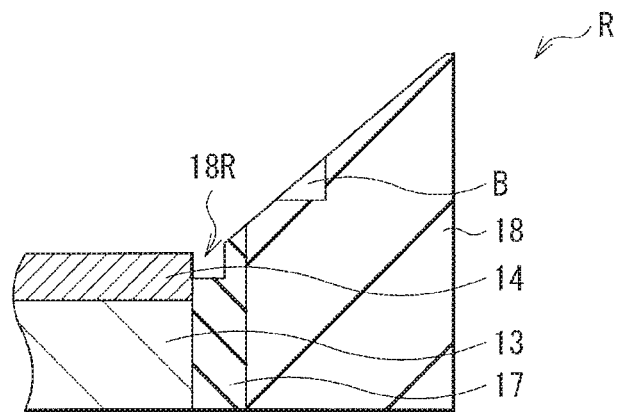
FIG. 25C is a schematic cross-sectional view of another example of a shape of an opening illustrated in FIG. 25A.

The opening formed by removing the adhesive layer B and the cap layer 35, i.e., the opening to which the second contact layer 14 is exposed preferably has a tapered shape as illustrated in FIG. 25C.

Figure 25D:
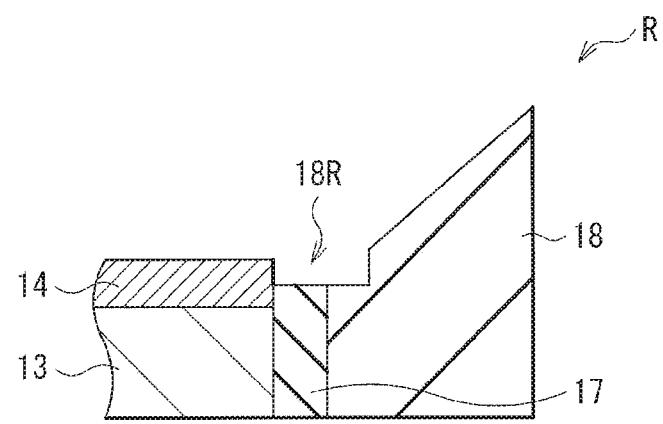
FIG. 25D is a schematic enlarged cross-sectional view (4) of a portion illustrated in FIG. 21E.

The region where the adhesive layer B and the cap layer 35 are to be removed may be further increased to remove the adhesive layer B together with the cap layer 35, as illustrated in FIG. 25D.

Even in the light-receiving device 2 formed by such a method, the buried layer 18 is formed in a manner similar to the manner described in the foregoing light-receiving device 1, which makes it possible to suppress occurrence of a defect in the manufacturing processes resulting from the level difference between the semiconductor layer 10S and the temporary substrate 33. Moreover, the cap layer 35 is formed, which prevents the semiconductor layer 10S (the second contact layer 14) from being in contact with the adhesive layer B.

The cap layer 35 may remain on the end portion of the second contact layer 14 in the light-receiving device 2 (FIGS. 23A to 23C). Alternatively, the cap layer 35 may be completely removed. In the light-receiving device 2 in which the cap layer 35 is completely removed, for example, the level difference between the top surface of the second contact layer 14 and the bottom surface of the adhesive layer B (FIGS. 24A to 24C) or the recess 18R between the end surface of the semiconductor layer 10S and the buried layer 18 (FIGS. 25A to 25D) is provided. In the light-receiving device 2, the buried layer 18 protrudes by the amount corresponding to the thicknesses of the cap layer 35 and the adhesive layer B from the semiconductor layer 10S toward the light incident surface S1.

Third Embodiment

Figure 26:
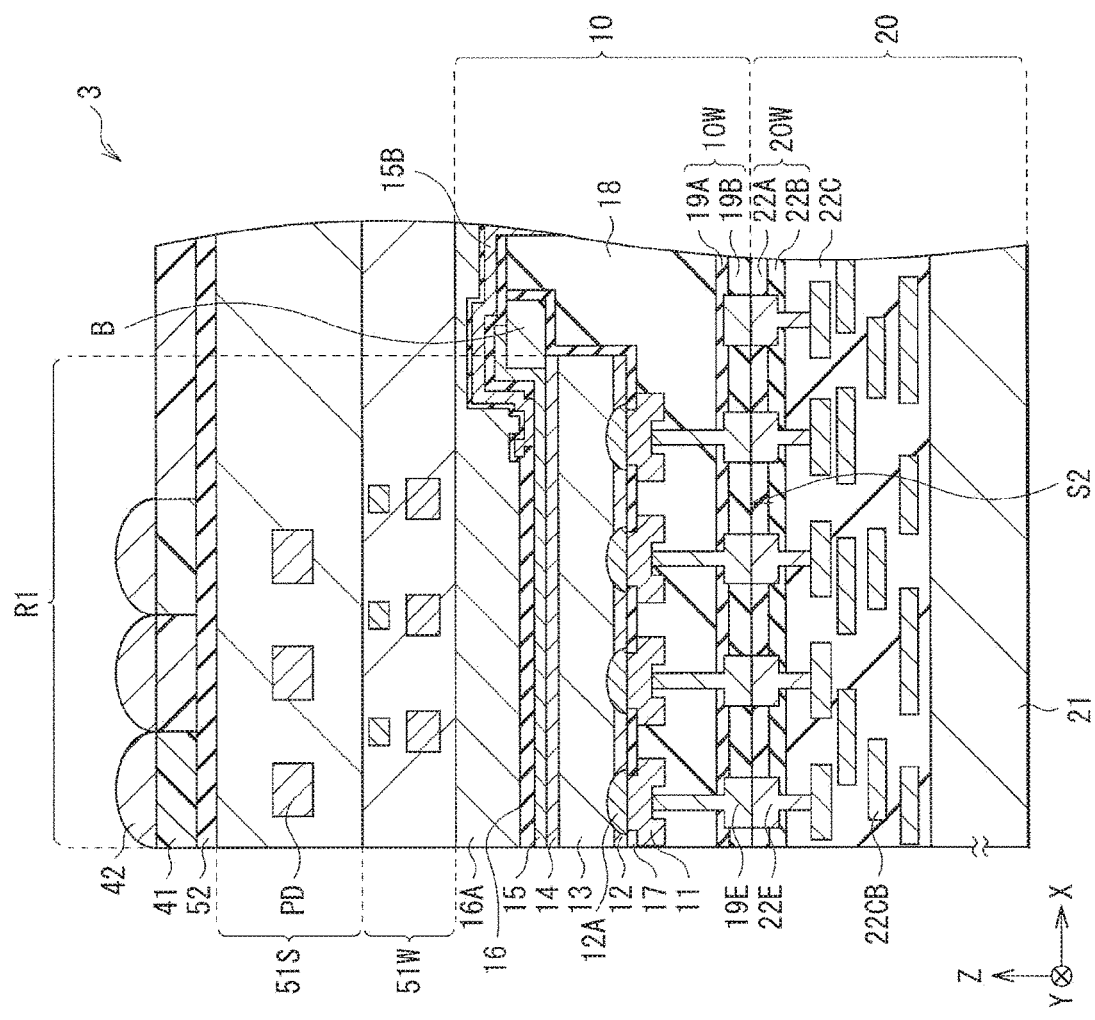
FIG. 26 is a schematic cross-sectional view of a schematic configuration of a light-receiving device according to a third embodiment of the present disclosure.

FIG. 26 schematically illustrates a cross-sectional configuration of a light-receiving device (a light-receiving device 3) according to a third embodiment. The light-receiving device 3 has a configuration, workings, and effects that are similar to those of the light-receiving device 1, with an exception that the light-receiving device 3 has a stacked structure of the device substrate 10 including the compound semiconductor material and a semiconductor layer including silicon (Si) (a semiconductor layer 51S, i.e., a second semiconductor layer).

The light-receiving device 3 includes a wiring layer 51W, the semiconductor layer 51S, the color filter layer 41, and the on-chip lens in this order on the light incident surface S1 of the device substrate 10. The wiring layer 51W is electrically coupled to the semiconductor layer 51S.

The semiconductor layer 51S includes a photodiode PD having p-n junction for each of the pixels P. The wiring layer 51W includes a plurality of wiring lines, and, for example, signal charges generated in the photodiode PD migrate to the readout circuit substrate 20 through the wiring layer 51W in each of the pixels P.

In the light-receiving device 3, for example, photoelectric conversion is performed on light of a wavelength in the visible region and the infrared region. For example, light of a wavelength in the visible region enters the semiconductor layer 51S through the on-chip lens 42 and the color filter layer 41, and is subjected to photoelectric conversion in the photodiode PD. In contrast, light of a wavelength in the infrared region passes through the semiconductor layer 51S, and is subjected to photoelectric conversion in the photoelectric conversion layer 13 of the device substrate 10. Signal charges generated in the photodiode PD and signal charges generated in the photoelectric conversion layer 13 are read by the readout circuit substrate 20.

Even in the light-receiving device 3 according to the present embodiment, the buried layer 18 is formed in a manner similar to those described in the foregoing light-receiving devices 1 and 2, which makes it possible to suppress occurrence of a defect in the manufacturing processes resulting from the level difference between the semiconductor layer 10S and the temporary substrate 33. Moreover, the semiconductor layer 51S is stacked on the device substrate 10, which makes it possible for one pixel P to perform photoelectric conversion on light of a wavelength in the visible region and light of a wavelength in the infrared region. This makes it possible to increase an amount of information obtainable from one pixel P.

First Application Example

Figure 27:
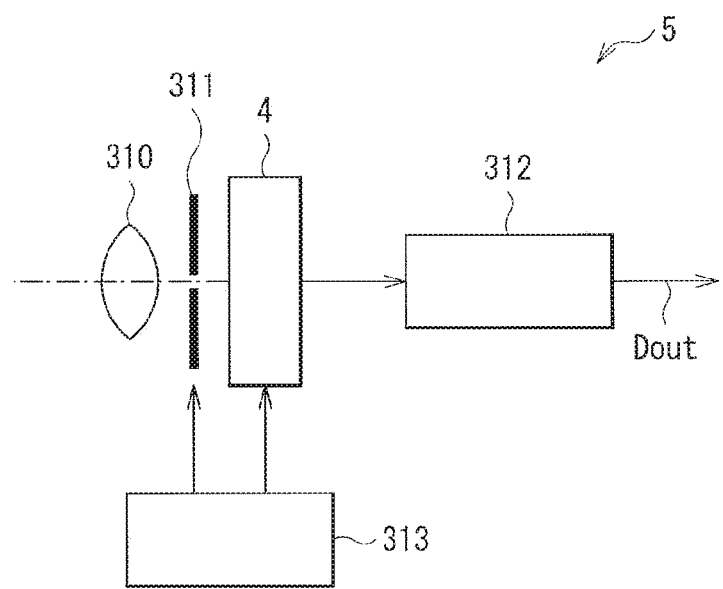
FIG. 27 is a functional block diagram illustrating an example of an electronic apparatus (a camera) that uses an imaging device.

Any of the light-receiving devices 1, 1A, 1B, 2, and 3 (hereinafter collectively referred to as the "light-receiving device 1") described in the foregoing embodiments and the like is applied to, for example, an imaging device. The imaging device is, for example, an infrared image sensor Second Application Example The imaging device as described above is applicable to various types of electronic apparatuses such as a camera that allows for imaging of an infrared region, for example. FIG. 27 illustrates a schematic configuration of an electronic apparatus 5 (a camera) as an example of such a camera. The electronic apparatus 5 is a camera that allows for shooting of a still image, a moving image, or both, for example. The electronic apparatus 5 includes an imaging device 4 including the light-receiving device 1, an optical system (an optical lens) 310, a shutter unit 311, a driver 313, and a signal processor 312. The driver 313 drives the imaging device 4 and the shutter unit 311.

The optical system 310 guides image light (incident light) obtained from an object to the imaging device 4. The optical system 310 may include a plurality of optical lenses. The shutter unit 311 controls a period in which the imaging device 4 is irradiated with the light and a period in which the light is blocked. The driver 313 controls a transfer operation of the imaging device 4 and a shutter operation of the shutter unit 311. The signal processor 312 performs various signal processes on the signal outputted from the imaging device 4. A picture signal Dout having been subjected to the signal processes is stored in a storage medium such as a memory, or outputted to a monitor or the like.

The light-receiving device 1 described by referring to the present embodiment and the like is also applicable to the following electronic apparatuses (a capsule endoscope and a mobile body such as a vehicle).

First Further Application Example (Endoscopic Surgery System)

The technique according to the present disclosure is applicable to various products. For example, the technique according to the present disclosure may be applied to an endoscopic surgery system.

Figure 28:
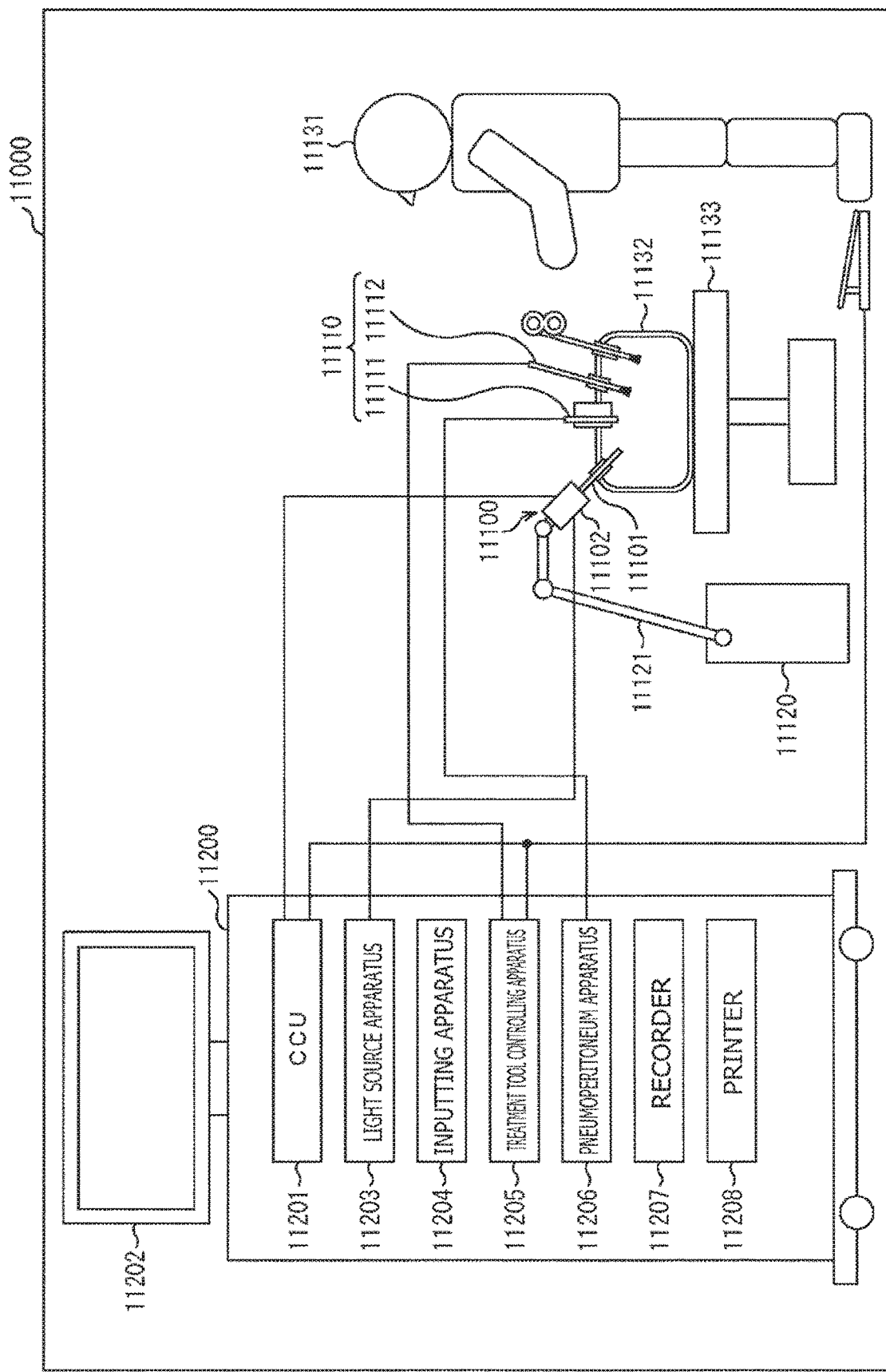
FIG. 28 is a view depicting an example of a schematic configuration of an endoscopic surgery system.

FIG. 28 is a view depicting an example of a schematic configuration of an endoscopic surgery system to which the technology according to an embodiment of the present disclosure (present technology) be applied.

In FIG. 28, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fated. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 29:
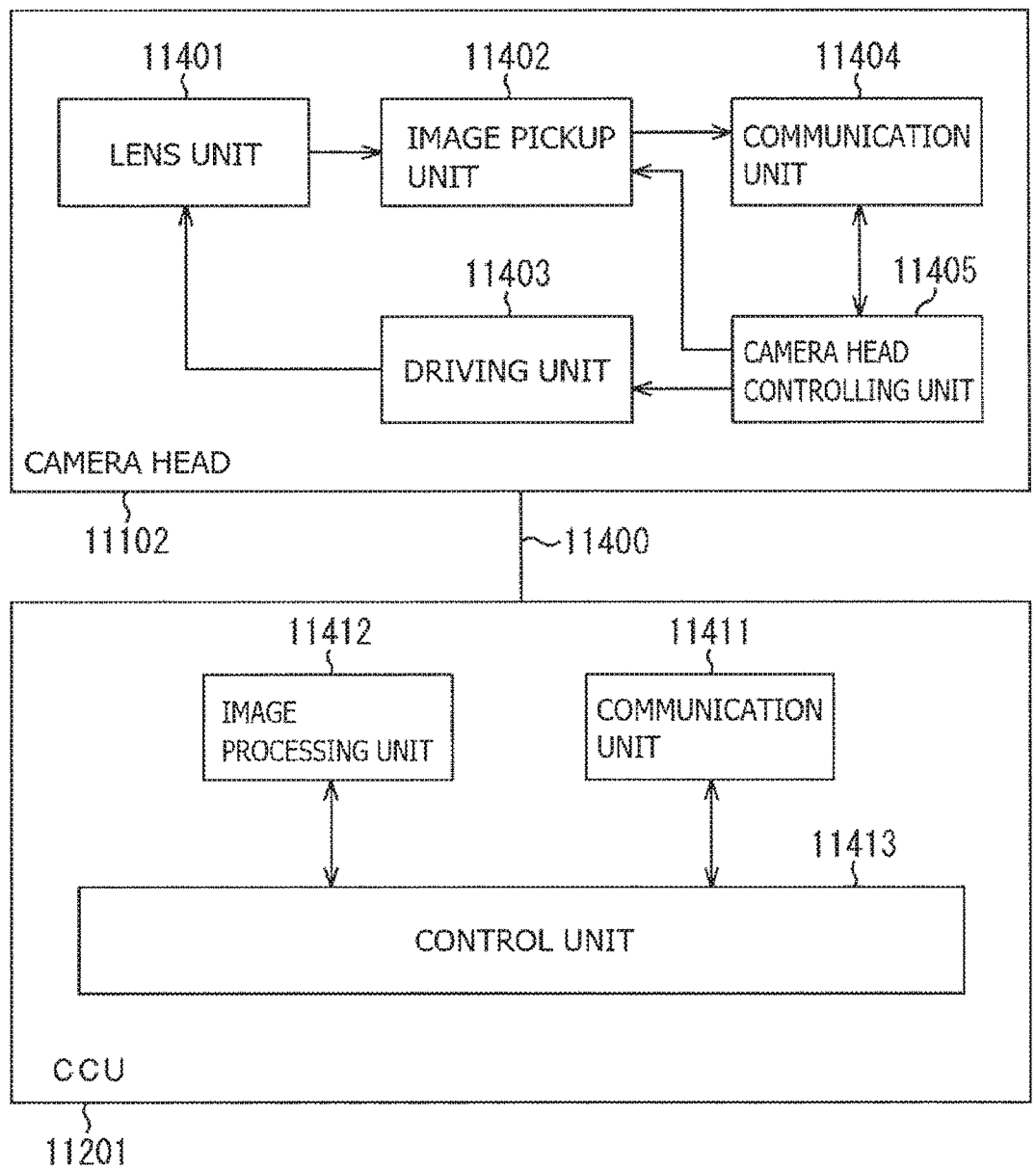
FIG. 29 is a block diagram depicting an example of a functional configuration of a camera head and a camera control unit (CCU).

FIG. 29 is a block diagram depicting an example of a functional configuration of the camera head 11102 and the CCU 11201 depicted in FIG. 28.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 acid display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of one example of the endoscopic surgery system to which the technology according to the present disclosure may be applied. The technology according to the present disclosure may be applied to the image pickup unit 11402 among the components of the configuration described above. Applying the technology according to the present disclosure to the image pickup unit 11402 makes it possible to obtain a clearer image of the surgical region. Hence, it is possible for the surgeon to confirm the surgical region with certainty.

Note that the description has been given above of the endoscopic surgery system as one example. The technology according to the present disclosure may be applied to, besides the endoscopic surgery system, a micrographic surgery system or the like.

Second Further Application Example (Mobile Body)

The technology according to the present disclosure is applicable to various products. For example, the technology according to the present disclosure may be achieved in the form of an apparatus to be mounted to a mobile body of any kind. Examples of the mobile body may include an automobile, an electric vehicle, a hybrid electric vehicle, a motorcycle, a bicycle, a personal mobility, an airplane, a drone, a vessel, and a robot.

Figure 30:
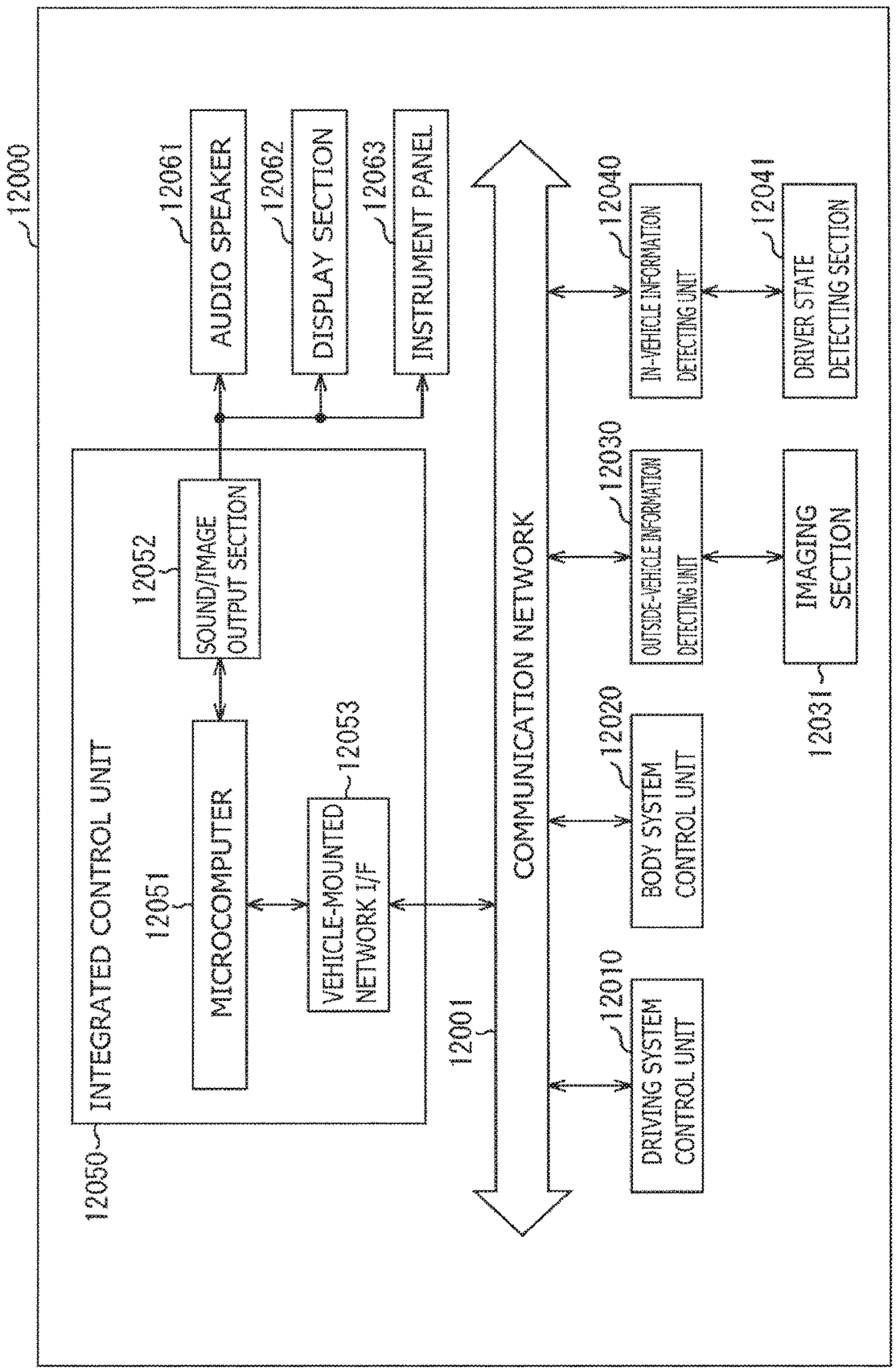
FIG. 30 is a block diagram depicting an example of schematic configuration of a vehicle control system.

FIG. 30 is a block diagram depicting an example of schematic configuration of a vehicle control system as an example of a mobile body control system to which the technology according to an embodiment of the present disclosure can be applied, The vehicle control system 12000 includes a plurality of electronic control units connected to each other via a communication network 12001. In the example depicted in FIG. 30, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 30, an audio speaker 12061, a display section 12062, and an instrument panel 12063 are illustrated as the output device. The display section 12062 may, for example, include at least one of an on-board display and a head-up display.

Figure 31:
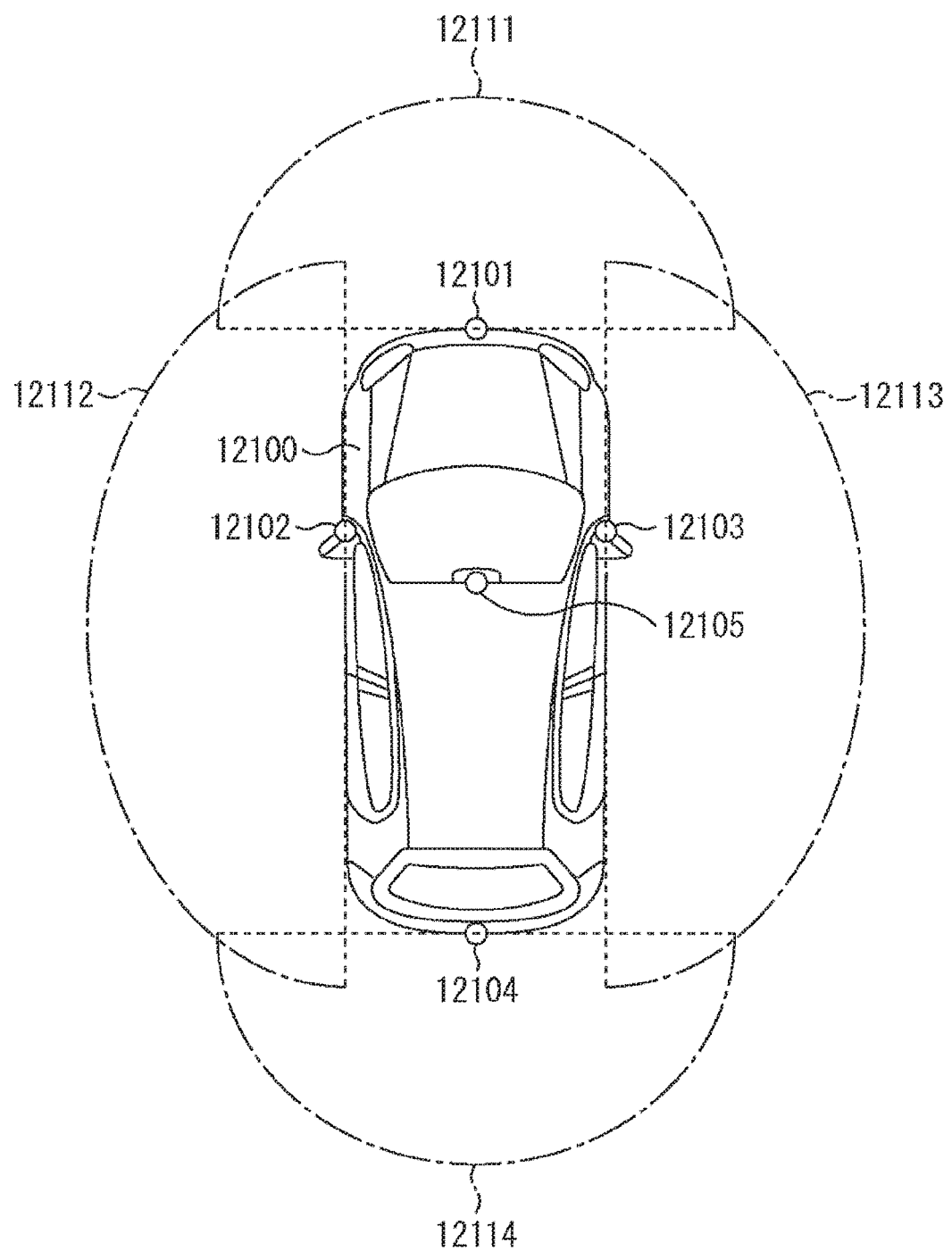
FIG. 31 is a diagram of assistance in explaining an example of installation positions of an outside-vehicle information detecting section and an imaging section.

FIG. 31 is a diagram depicting an example of the installation position of the imaging section 12031.

In FIG. 31, the imaging section 12031 includes imaging sections 1210, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 31 depicts an example of photographing ranges of the imaging sections 12101 to 12104. An imaging range 12111 represents the imaging range of the imaging section 12101 provided to the from nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system to which the technology according to the present disclosure may be applied. The technology according to the present disclosure may be applied to the imaging section 12031 among the components of the configuration described above. Applying the technology according to the present disclosure to the imaging section 12031 makes it possible to obtain a captured image which is easier to see. Hence, it is possible to reduce the fatigue of the driver.

Moreover, the light-receiving device 1 described in the present embodiment and the like may be applicable to electronic apparatuses such as a surveillance camera, a biometric authentication system, and a thermograph. Examples of the surveillance camera may include night vision systems (night scopes). Application of the light-receiving device 1 to the surveillance camera makes it possible to recognize a pedestrian, an animal, and the like at night from a distance. Moreover, influences of a headlight and weather are reduced by application of the light-receiving device 1 to a vehicle-mounted camera. For example, it is possible to capture an image by shooting without influences of, for example, smoke, fog, and the like. Further, it is possible to recognize a shape of an object. Furthermore, the thermograph allows for contactless temperature measurement. The thermograph allows for detection of a temperature distribution and heat generation. In addition, the light-receiving device 1 may be applicable to electronic apparatuses that detect, for example, tire, water, gas, and the like.

Although the description has been given by referring to the embodiments and the application examples, the contents of the present disclosure are not limited to the embodiments and the like, and may be modified in a variety of ways. For example, the layer configuration of any of the light-receiving devices described in the foregoing embodiments is illustrative, and may further include any other layer. The materials and thicknesses of the respective layers are also illustrative and are not limited to those described above. For example, the embodiments and the like have been described by referring to an example in which the first contact layer 12, the photoelectric conversion layer 13, and the second contact layer 14 configures the semiconductor layer 10S. However, it may be only necessary for the semiconductor layer 10S to include the photoelectric conversion layer 13. For example, the semiconductor layer 10S may not include the first contact layer 12 and the second contact layer 14, or may include any other layer Further, the embodiments and the like have been described by referring to an example in which the signal charges are the holes for description purpose. In an alternative example, the signal charges may be the electrons. For example, the diffusion region may include an n-type impurity.

In addition, the embodiments and the like have been described by referring to the light-receiving device that is a specific example of a semiconductor device according to the present technology; however, the semiconductor device may be a device other than the light-receiving device. An alternative example of the semiconductor device according to the present technology may be a light-emitting device.

It is to be noted that the effects described in the embodiments and the like are illustrative and non-limiting. Effects to be achieved by the present disclosure may be effects that are other than those described above, or may further include other effects in addition to those described above.

It is to be noted that the present disclosure may have the following configurations.

(1)

A semiconductor device including:

a device substrate including a device region and a peripheral region, the device region in which a wiring layer and a first semiconductor layer including a compound semiconductor material are stacked, and the peripheral region disposed outside the device region; and a readout circuit substrate that faces the first semiconductor layer with the wiring layer in between and is electrically coupled to the first semiconductor layer through the wiring layer, the peripheral region of the device substrate having a junction surface with the readout circuit substrate.

(2)

The semiconductor device according to (1), in which the device region of the device substrate is bonded to the readout circuit substrate on the same plane as the junction surface of the peripheral region.

(3)

The semiconductor device according to (1) or (2), in which the device substrate further includes a buried layer surrounding the first semiconductor layer in the peripheral region.

(4)

The semiconductor device according to (3), further including:

a first electrode that is provided in the wiring layer and is electrically coupled to the first semiconductor layer; and a second electrode facing the first electrode with the first semiconductor layer in between.

(5)

The semiconductor device according to (4), in which the device substrate further includes a through-hole in the buried layer, the through-hole that allows the second electrode and the readout circuit substrate to be electrically coupled to each other.

(6)

The semiconductor device according to any one of (3) to (5), in which the buried layer protrudes from the first semiconductor layer toward side opposite to side on which the readout circuit substrate is located.

(7)

The semiconductor device according to any one of (3) to (6), in which the first semiconductor layer and the buried layer has a recess therebetween.

(8)

The semiconductor device according to any one of (3) to (7), in which the buried layer is provided in a thickness direction of the first semiconductor layer.

(9)

The semiconductor device according to any one of (1) to (8), in which the device substrate further includes a cap layer on an outer edge of a surface of the first semiconductor layer, the surface being opposite to a surface facing the readout circuit substrate of the first semiconductor layer.

(10)

The semiconductor device according to any one of (1) to (9), in which the wiring layer is also provided in the peripheral region.

(11)

The semiconductor device according to any one of (1) to (10), in which the compound semiconductor material absorbs light of a wavelength in an infrared region.

(12)

The semiconductor device according to any one of (1) to (11), in which the compound semiconductor material is any one of indium gallium arsenide (InGaAs), indium arsenide antimonide (InAsSb), indium arsenide (InAs), indium antimonide (InSb), and mercury cadmium telluride (HgCdTe).

(13)

The semiconductor device according to any one of (1) to (12), further including an on-chip lens on side on which a surface of the first semiconductor layer is located, the surface being opposite to a surface facing the readout circuit substrate of the first semiconductor layer.

(14)

The semiconductor device according to any one of (1) to (13), further including a second semiconductor layer that is stacked on the device substrate and includes a photodiode.

(15)

A method of manufacturing a semiconductor device including:

forming a semiconductor layer that includes a compound semiconductor material;

bonding the semiconductor layer to a temporary substrate;

forming a buried layer that fills a level difference between the semiconductor layer and the temporary substrate;

forming a wiring layer on a surface of the semiconductor layer, the surface being opposite to a junction surface with the temporary substrate; and providing a readout circuit substrate to face the semiconductor layer with the wiring layer in between and electrically coupling the semiconductor layer and the readout circuit substrate to each other through the wiring layer.

(16)

The method of manufacturing the semiconductor device according to (15), in which after bonding the semiconductor layer to the temporary substrate, etching is performed on the semiconductor layer.

(17)

The method of manufacturing the semiconductor device according to (15) or (16), in which a cap layer is stacked on the semiconductor layer, and thereafter the semiconductor layer is bonded to the temporary substrate with the cap layer in between.

(18)

The method of manufacturing the semiconductor device according to (17), in which the semiconductor layer is bonded to the temporary substrate by an adhesive layer provided between the cap layer and the temporary substrate.

(19)

The method of manufacturing the semiconductor device according to any one of (15) to (18), in which two or more of the semiconductor layers are bonded to the temporary substrate while being separated from one another.

(20)

An electronic apparatus that includes a semiconductor device, the semiconductor device including:

a device substrate including a device region and a peripheral region, the device region in which a wiring layer and a semiconductor layer including a compound semiconductor material are stacked, and the peripheral region disposed outside the device region; and a readout circuit substrate that faces the semiconductor layer with the wiring layer in between and is electrically coupled to the semiconductor layer through the wiring layer, the peripheral region of the device substrate having a junction surface with the readout circuit substrate.

This application claims the benefit of Japanese Priority Patent Application No. 2017-082562 filed with the Japan Patent Office on Apr. 19, 2017 and International Application PCT/JP2018/009038 filed with the Japan Patent Office as a receiving office on Mar. 8, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
a device substrate including a device region and a peripheral region, wherein a wiring layer and a first semiconductor layer including a compound semiconductor material are stacked in the device region, and wherein the peripheral region is disposed outside the device region;
a second semiconductor layer that is stacked on the device substrate, wherein the second semiconductor layer includes a photodiode; and
a readout circuit substrate that faces the first semiconductor layer, wherein the wiring layer is between the readout circuit and the first semiconductor layer, and wherein the readout circuit is electrically coupled to the first semiconductor layer through the wiring layer, and wherein the peripheral region of the device substrate includes a junction surface with the readout circuit substrate.

2. The semiconductor device according to claim 1, wherein the device region of the device substrate is bonded to the readout circuit substrate on the same plane as the junction surface of the peripheral region.

3. The semiconductor device according to claim 1, wherein the device substrate further includes a buried layer surrounding the first semiconductor layer in the peripheral region.

4. The semiconductor device according to claim 3, further comprising:
a first electrode that is provided in the wiring layer and is electrically coupled to the first semiconductor layer; and
a second electrode facing the first electrode with the first semiconductor layer in between.

5. The semiconductor device according to claim 4, wherein the device substrate further includes a through-hole in the buried layer, wherein the through-hole allows the second electrode and the readout circuit substrate to be electrically coupled to each other.

6. The semiconductor device according to claim 3, wherein the buried layer protrudes from the first semiconductor layer toward a side opposite to a side on which the readout circuit substrate is located.

7. The semiconductor device according to claim 3, wherein the first semiconductor layer and the buried layer have a recess therebetween.

8. The semiconductor device according to claim 3, wherein the buried layer is provided in a thickness direction of the first semiconductor layer.

9. The semiconductor device according to claim 1, wherein the device substrate further includes a cap layer on an outer edge of a surface of the first semiconductor layer, the surface being opposite to a surface facing the readout circuit substrate of the first semiconductor layer.

10. The semiconductor device according to claim 1, wherein the wiring layer is also provided in the peripheral region.

11. The semiconductor device according to claim 1, wherein the compound semiconductor material absorbs light of a wavelength in an infrared region.

12. The semiconductor device according to claim 1, wherein the compound semiconductor material is any one of indium gallium arsenide (InGaAs), indium arsenide antimonide (InAsSb), indium arsenide (InAs), indium antimonide (InSb), and mercury cadmium telluride (HgCdTe).

13. The semiconductor device according to claim 1, further comprising an on-chip lens on a side on which a surface of the first semiconductor layer is located, the surface being opposite to a surface facing the readout circuit substrate of the first semiconductor layer.

14. A method of manufacturing a semiconductor device, comprising:
forming a semiconductor layer that includes a compound semiconductor material;
bonding the semiconductor layer to a temporary substrate;
forming a buried layer that fills a level difference between the semiconductor layer and the temporary substrate;
forming a wiring layer on a surface of the semiconductor layer, the surface being opposite to a junction surface with the temporary substrate; and
providing a readout circuit substrate to face the semiconductor layer with the wiring layer in between and electrically coupling the semiconductor layer and the readout circuit substrate to each other through the wiring layer.

15. The method of manufacturing the semiconductor device according to claim 14, wherein, after bonding the semiconductor layer to the temporary substrate, etching is performed on the semiconductor layer.

16. The method of manufacturing the semiconductor device according to claim 14, wherein a cap layer is stacked on the semiconductor layer, and thereafter the semiconductor layer is bonded to the temporary substrate with the cap layer in between.

17. The method of manufacturing the semiconductor device according to claim 16, wherein the semiconductor layer is bonded to the temporary substrate by an adhesive layer provided between the cap layer and the temporary substrate.

18. The method of manufacturing the semiconductor device according to claim 14, wherein two or more of the semiconductor layers are bonded to the temporary substrate while being separated from one another.

19. An electronic apparatus that includes a semiconductor device, the semiconductor device, comprising:
- a device substrate including a device region and a peripheral region, wherein a wiring layer and a first semiconductor layer including a compound semiconductor material are stacked in the device region, and wherein the peripheral region is disposed outside the device region;
- a second semiconductor layer that is stacked on the device substrate, wherein the second semiconductor layer includes a photodiode; and
- a readout circuit substrate that faces the first semiconductor layer, wherein the wiring layer is between the readout circuit and the first semiconductor layer, and wherein the readout circuit is electrically coupled to the first semiconductor layer through the wiring layer, and
- wherein the peripheral region of the device substrate includes a junction surface with the readout circuit substrate.

* * * * *